(12) United States Patent
Arimura

(10) Patent No.: US 8,632,953 B2
(45) Date of Patent: *Jan. 21, 2014

(54) PROCESS FOR MAKING LITHOGRAPHIC PRINTING PLATE

(75) Inventor: Keisuke Arimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 430 days.

This patent is subject to a terminal disclaimer.

(21) Appl. No.: 12/565,391

(22) Filed: Sep. 23, 2009

(65) Prior Publication Data

US 2010/0081090 A1    Apr. 1, 2010

(30) Foreign Application Priority Data

Sep. 26, 2008   (JP) .................................. 2008-249123

(51) Int. Cl.
| | | |
|---|---|---|
| *G03F 7/00* | (2006.01) | |
| *G03F 7/26* | (2006.01) | |
| *B41M 5/00* | (2006.01) | |
| *G03C 5/26* | (2006.01) | |

(52) U.S. Cl.
USPC ..... 430/302; 101/453; 101/463.1; 430/270.1; 430/434

(58) Field of Classification Search
USPC ............. 430/302, 434; 101/450.1, 453, 463.1
See application file for complete search history.

(56) References Cited

U.S. PATENT DOCUMENTS

| | | | |
|---|---|---|---|
| 2004/0063029 A1* | 4/2004 | Aoai et al. ................. | 430/270.1 |
| 2004/0068026 A1 | 4/2004 | Kunita | |
| 2006/0257783 A1* | 11/2006 | Sugasaki ..................... | 430/270.1 |
| 2007/0298351 A1* | 12/2007 | Shimada et al. ........... | 430/281.1 |
| 2008/0044758 A1* | 2/2008 | Tao et al. .................... | 430/270.1 |
| 2008/0261146 A1* | 10/2008 | Kojima ....................... | 430/270.1 |
| 2009/0148794 A1* | 6/2009 | Baumann et al. ............ | 430/302 |
| 2011/0020751 A1* | 1/2011 | Taguchi et al. ............... | 430/302 |

FOREIGN PATENT DOCUMENTS

| | | |
|---|---|---|
| EP | 1868036 A1 | 12/2007 |
| JP | 11-065126 A | 3/1999 |
| JP | 2007-047742 A | 2/2007 |
| JP | 2008-171012 A | 7/2008 |
| WO | 2005/064402 A1 | 7/2005 |
| WO | WO 2009119827 A1 * | 10/2009 |

OTHER PUBLICATIONS

Office Action dated Aug. 21, 2012 in Japanese Application No. JP 2008-249123.

* cited by examiner

*Primary Examiner* — Chanceity Robinson
(74) *Attorney, Agent, or Firm* — Sughrue Mion, PLLC

(57) ABSTRACT

A process for making a lithographic printing plate, comprising: an exposure step of imagewise exposing a lithographic printing plate precursor that comprises, above a hydrophilic support, a photosensitive layer comprising (A) a compound that generates a radical upon the application of light or heat, (B) a polymer having an aromatic carboxy group in a side chain, (C) a polymerizable compound, and (D) an infrared absorber; and a development processing step using one type of processing liquid, wherein the processing liquid has a pH of 8.5 to 10.8.

11 Claims, 1 Drawing Sheet

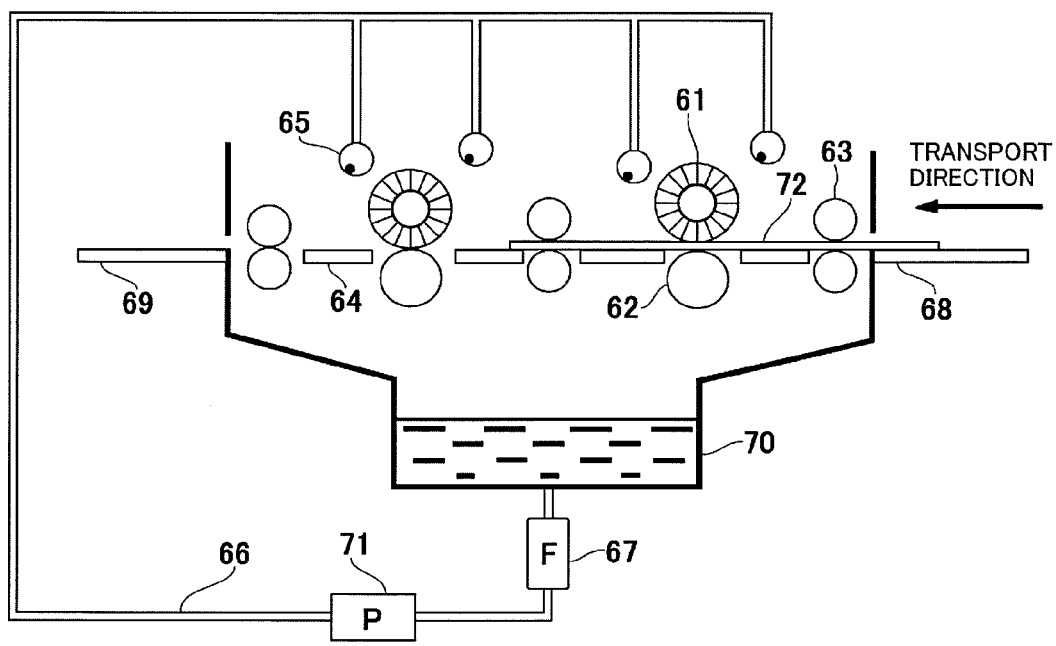

PROCESS FOR MAKING LITHOGRAPHIC PRINTING PLATE

BACKGROUND OF THE INVENTION

1. Field of the Invention

The present invention relates to a process for making a lithographic printing plate.

2. Description of the Related Art

In general, a lithographic printing plate is formed from a lipophilic image area for accepting ink and a hydrophilic non-image area for accepting dampening water in a printing process. Lithographic printing is a printing process in which the property of water and printing ink repelling each other is utilized so as to cause a difference in ink attachment on the surface of a lithographic printing plate with a lipophilic image area of the lithographic printing plate as an ink-accepting area and a hydrophilic non-image area as a dampening water-accepting area (non-ink-accepting area), and after inking only the image area ink is transferred to a printing substrate such as paper.

In order to make this lithographic printing plate, a lithographic printing plate precursor (PS plate) formed by providing a lipophilic photosensitive resin layer (photosensitive layer, image recording layer) on a hydrophilic support is widely used in the art. A lithographic printing plate is usually obtained by a process in which, after the lithographic printing plate precursor is exposed through an original image such as a lith film, an area that becomes an image area of the image recording layer is made to remain, and unwanted image recording layer other than this is removed by dissolving using an alkaline developer or an organic solvent to thus form a non-image area in which the surface of the hydrophilic support is exposed.

In this way, in the conventionally known plate-making process of a lithographic printing plate precursor, after the exposure, a step of removing unnecessary image recording layer by dissolving, for example, with a developer is required, but from the viewpoint of the environment and safety carrying out processing with a developer that is closer to neutral or reducing the amount of liquid waste are cited as issues. In particular, since in recent years the disposal of liquid waste discharged accompanying wet treatment has become a great concern throughout the industrial world from the viewpoint of consideration for the global environment, the demand for resolving the above-mentioned issues has been more and more increasing.

On the other hand, digitization techniques involving electronically processing, storing, and outputting image information by computer have been widespread in recent years, and various new image output methods responding to such digitization techniques have been put into practical use. Accompanying this, a computer-to-plate (CTP) technique has been attracting attention in which digitized image information is carried on a highly convergent radiant ray such as laser light and a lithographic printing plate precursor is scan-exposed by this light to directly produce a lithographic printing plate without intervention of a lith film. Therefore, obtaining a lithographic printing precursor suitable for these techniques has become one of the important technological challenges.

As described above, there has been an increasingly strong desire for decreasing the alkalinity of a developer and simplifying the processing step from the viewpoints of both the concerns for the global environment and the conformity with space saving and low running cost.

For example, JP-A-11-65126 (JP-A denotes a Japanese unexamined patent application publication) proposes a development method in which processing is carried out using an aqueous solution having a pH of 8.5 to 11.5.

Furthermore, one embodiment of EP-A-1868036 describes one-bath processing using a processing liquid comprising a water-soluble resin and having a pH of 11.9 to 12.1.

International Patent Application WO 2005/064402 discloses a negative photosensitive composition comprising: (A) an infrared absorber, (B) an organic boron compound which has a function as a polymerization initiator when used in combination with the infrared absorber (A), (C) an onium salt, and (D) a compound having a polymerizable unsaturated group.

BRIEF SUMMARY OF THE INVENTION

As described above, the development processing step generally comprises three stages, that is, developing using an aqueous solution of an alkali having a pH of at least 10, then washing away alkali agent using a water washing bath, and subsequently treating using a gumming liquid containing a hydrophilic resin as a main component; because of this an automatic processor itself occupies a large space, and there are still problems in terms of the environment and running cost such as disposal of development effluent, water washing effluent, and gumming effluent.

In JP-A-11-65126, since water washing and gumming liquid processing steps are required, the environmental and running cost problems cannot be solved.

Furthermore, in EP-A-1868036, since an alkaline processing liquid with a pH of 12 stays attached to the surface of the obtained printing plate, in addition to concerns about operator safety, there is a problem that, when the time from preparation of the printing plate to printing gets longer, the image area gradually dissolves, resulting in deterioration of plate life and chemical resistance.

Furthermore, since in WO 2005/064402 the mode is one in which a gumming treatment is not carried out, the surface protection function is poor, that is, a non-image area is easily marked by external factors, leading in particular to the problem of print marking that is caused when a non-image area of a developed plate is handled by a bare hand (hereafter called 'fingerprint marking').

It is an object of the present invention to solve the above-mentioned problems and attain the object below.

Specifically, the object of the present invention is to provide a process for making a lithographic printing plate that excels in plate life and development processability and suppresses fingerprint marking.

The object of the present invention has been attained by means described in (1). It is described below together with (2) to (9), which are preferred embodiments.

(1) A process for making a lithographic printing plate, comprising an exposure step of imagewise exposing a lithographic printing plate precursor that comprises, above a hydrophilic support, a photosensitive layer containing (A) a compound that generates a radical upon the application of light or heat, (B) a polymer having an aromatic carboxy group in a side chain, (C) a polymerizable compound, and (D) an infrared absorber, and a development processing step using one type of processing liquid, wherein the processing liquid has a pH of 8.5 to 10.8, (2) the process for making a lithographic printing plate according to (1) above, wherein the processing liquid is an aqueous solution comprising a buffering agent, and a surfactant and/or a water-soluble polymeric compound, (3) the process for making a lithographic printing plate according to (2) above, wherein the buffering agent comprises a carbonate salt, (4) the process for making a lithographic printing plate according to any one of (1) to (3) above, wherein the processing liquid comprises a low-molecular weight hydroxycarboxylic acid and/or a salt thereof, (5) the process for making a lithographic printing plate according to (4) above, wherein the low-molecular weight hydroxycarboxylic acid has two or more carboxy groups, (6) the process for making a lithographic printing plate according to (4) or (5) above, wherein the low-molecular weight hydroxycarboxylic acid is at least one type selected from the group consisting of citric acid, tartaric acid, and malic acid, (7) the process for making a lithographic printing plate according to any one of (1) to (6) above, wherein the polymer (B) having an aromatic carboxy group in a side chain further has a cyano group in a side chain, (8) the process for making a lithographic printing plate according to any one of (1) to (7) above, wherein a water-washing step is not carried out either prior to or subsequent to the development processing step, and (9) the process for making a lithographic printing plate according to any one of (1) to (8) above, wherein the development processing step is a step of carrying out in one bath at least two from removal of a protective layer, removal of unexposed photosensitive layer, and a gumming treatment.

BRIEF DESCRIPTION OF DRAWINGS

FIG. 1 is an explanatory diagram showing the structure of an automatic development processor.

EXPLANATION OF REFERENCE NUMERALS AND SYMBOLS

4 Lithographic printing plate precursor
6 Development section
10 Drying section
16 Transport roller
20 Development tank
22 Transport roller
24 Brush roller
26 Squeegee roller
28 Backup roller
36 Guide roller
38 Skewer roller

DETAILED DESCRIPTION OF THE INVENTION

A process for making a lithographic printing plate of the present invention comprises an exposure step of imagewise exposing a lithographic printing plate precursor that comprises, above a hydrophilic support, a photosensitive layer comprising (A) a compound that generates a radical upon the application of light or heat, (B) a polymer having an aromatic carboxy group in a side chain, (C) a polymerizable compound and (D) an infrared absorber, and a development processing step using one single type of processing liquid, wherein the processing liquid has a pH of from 8.5 to 10.8. Incidentally, "from 8.5 to 10.8" is the same meaning of "not less than 8.5 and not more than 10.8", and this is also applied to the expression of other numerical ranges if not otherwise noted.

(A) Compound that Generates a Radical Upon the Application of Light or Heat

The compound (A) which can generate radicals upon the application of light or heat (hereinafter, called the 'radical generator' as the case may be), which is used in the invention, may be any compound that can generate radicals by receiving light or heat.

Examples of the radical generators include organic boron salts, onium salt compounds, trihaloalkyl-substituted compounds (e.g., trihaloalkyl-substituted nitrogen-containing heterocyclic compounds including, for example, s-triazine compounds, oxadiazole derivatives, trihaloalkylsulfonyl compounds), hexaarylbisimidazoles, titanocene compounds, ketoxime compounds, thio compounds, organic peroxide, and the like.

In the present invention, among these radical generators, in particular, organic boron salts and onium salts are preferable. Combined use of an organic boron salt and an onium salt compound is more preferable.

The preferred organic boron anion that constitutes the organic boron salt may be represented by Formula (1) below.

(1)

In Formula (1), $R^{11}$, $R^{12}$, $R^{13}$ and $R^{14}$ may be the same or different from each other and each denotes an alkyl group, an aryl group, an aralkyl group, an alkenyl group, an alkynyl group, a cycloalkyl group or a heterocyclic group. It is particularly preferable that any one of $R^{11}$, $R^{12}$, $R^{13}$ and $R^{14}$ is an alkyl group and the others of these groups are aryl groups.

The above-mentioned organic boron anion exists together with a cation that forms a salt with the anion. Examples of the cation in this case include an alkali metal ion, an onium ion and a cationic sensitizing dye.

Examples of the onium ion include an ammonium ion, a sulfonium ion, an iodonium ion and a phosphonium ion.

In the case that a salt of an organic boron anion and an alkali metal ion or onium ion is used as the organic boron salt, a sensitizing dye (called 'infrared absorber (D)' in the present invention) is added to impart photosensitivity at light-wavelengths that the dye can absorb. Furthermore, in the case that a salt composed of the cationic sensitizing dye and the organic boron anion as the counter anion is used as the organic boron salt, photosensitivity is imparted in accordance with the absorption wavelength of the cationic sensitizing dye. However, in the latter case, it is preferable that a salt of an alkali metal ion or onium ion and an organic boron anion is further contained therewith.

The organic boron salt used in the present invention is preferably a salt containing an organic boron anion represented by Formula (1), and an alkali metal ion or onium ion is preferably used as a cation to form the salt. A salt of an organic boron anion and an onium ion is particularly preferable, and specific examples thereof include ammonium salts such as tetraalkylammonium salts, sulfonium salts such as triarylsulfonium salts, and phosphonium salts such as triarylalkylphosphonium salts.

The following are specific examples of particularly preferable organic boron salts (BC-1) to (BC-6).

In the specific examples below, Me denotes a methyl group, n-Bu denotes a n-butyl group, Ph denotes a phenyl group and t-Bu denotes a t-butyl group.

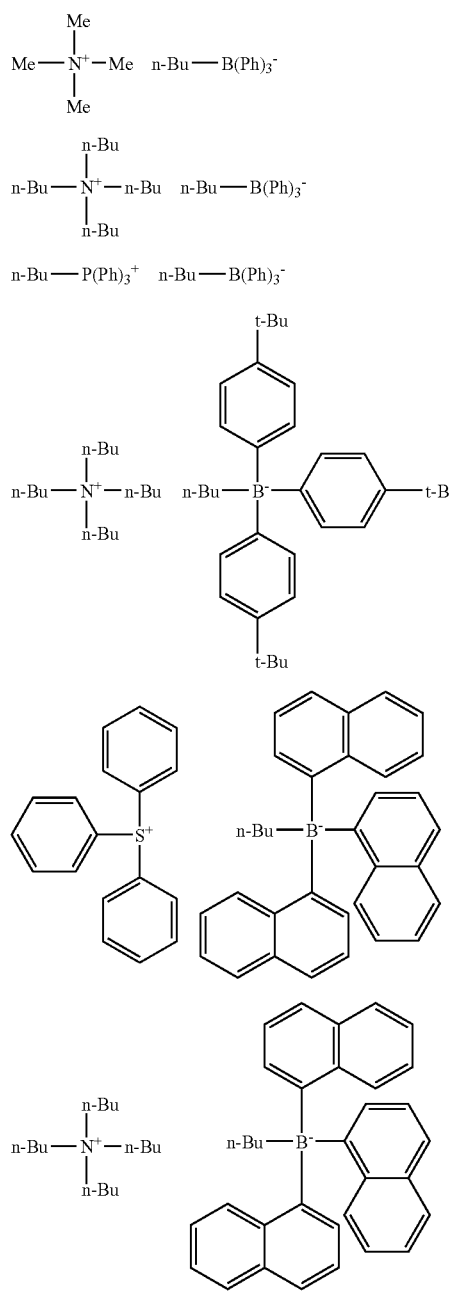

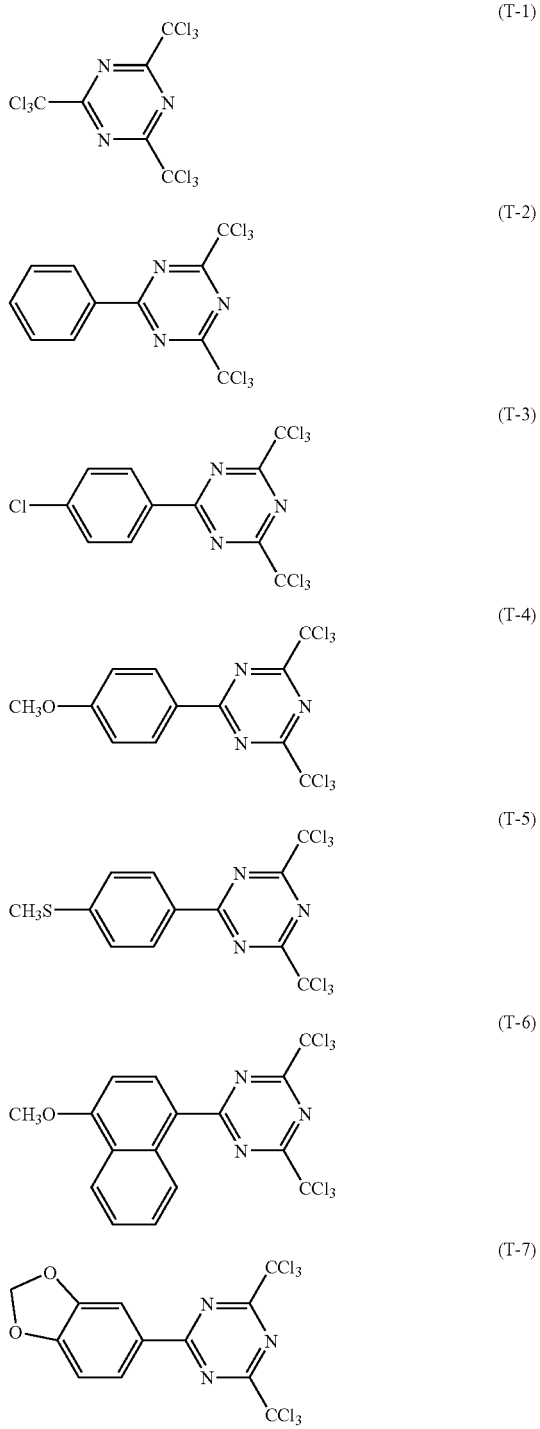

In the present patent, a trihaloalkyl-substituted compound may be cited as another preferable radical generator. The trihaloalkyl-substituted compound is specifically a compound having at least one trihaloalkyl group such as a trichloromethyl group and a tribromomethyl group in the molecule, and preferable examples thereof include compounds in which the trihaloalkyl group is bonded to a nitrogen-containing heterocyclic group, such as s-triazine derivatives and oxadiazole derivatives, and trihaloalkylsulfonyl compounds in which the trihaloalkyl group is bonded to an aromatic ring or a nitrogen-containing heterocyclic ring via a sulfonyl group.

Particularly preferable specific examples (T-1) to (T-15) of the compounds in which a trihaloalkyl group is bonded to a nitrogen-containing heterocyclic group, and particularly preferable specific examples (BS-1) to (BS-10) of the trihaloalkylsulfonyl compounds are illustrated below. In the specific examples below, Me denotes a methyl group.

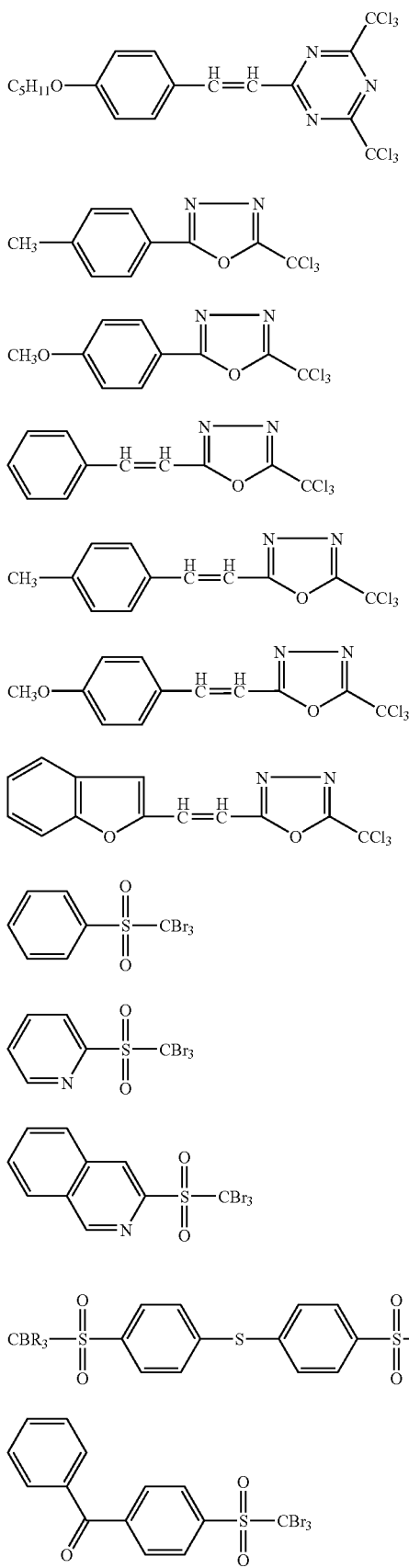

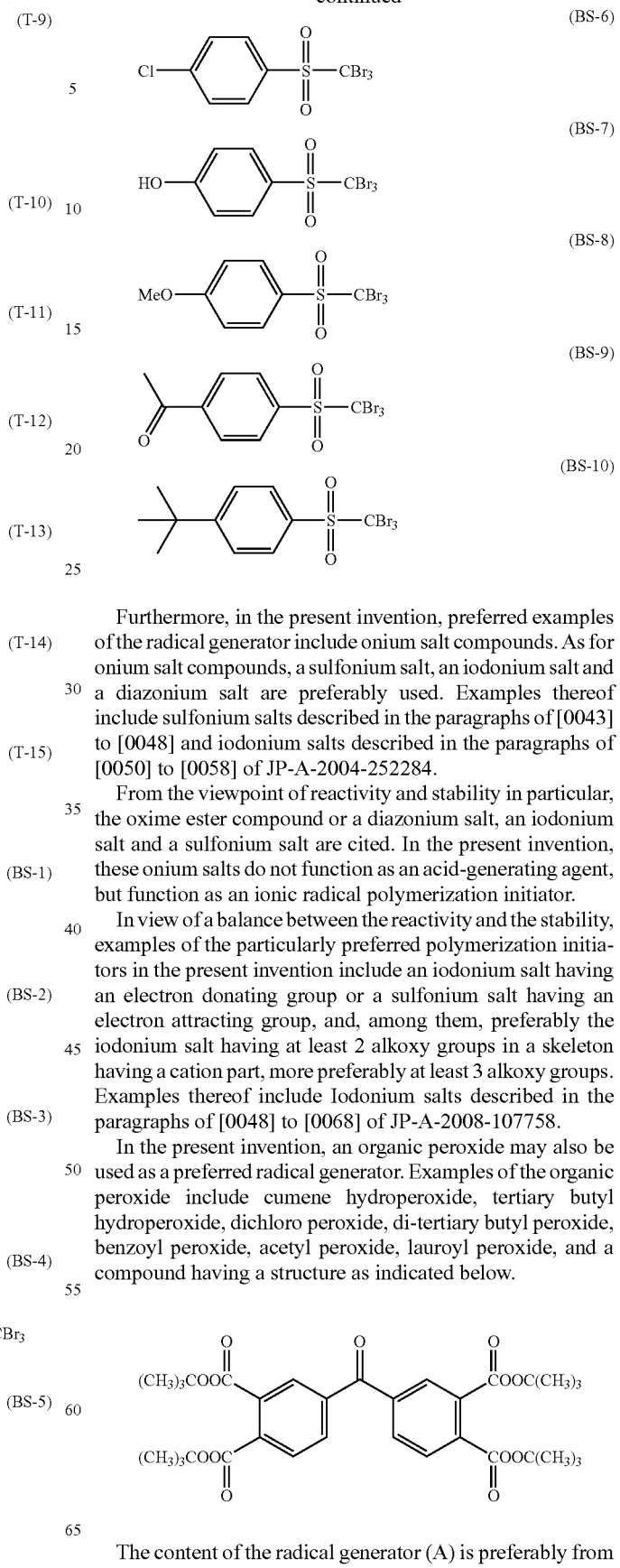

Furthermore, in the present invention, preferred examples of the radical generator include onium salt compounds. As for onium salt compounds, a sulfonium salt, an iodonium salt and a diazonium salt are preferably used. Examples thereof include sulfonium salts described in the paragraphs of [0043] to [0048] and iodonium salts described in the paragraphs of [0050] to [0058] of JP-A-2004-252284.

From the viewpoint of reactivity and stability in particular, the oxime ester compound or a diazonium salt, an iodonium salt and a sulfonium salt are cited. In the present invention, these onium salts do not function as an acid-generating agent, but function as an ionic radical polymerization initiator.

In view of a balance between the reactivity and the stability, examples of the particularly preferred polymerization initiators in the present invention include an iodonium salt having an electron donating group or a sulfonium salt having an electron attracting group, and, among them, preferably the iodonium salt having at least 2 alkoxy groups in a skeleton having a cation part, more preferably at least 3 alkoxy groups. Examples thereof include Iodonium salts described in the paragraphs of [0048] to [0068] of JP-A-2008-107758.

In the present invention, an organic peroxide may also be used as a preferred radical generator. Examples of the organic peroxide include cumene hydroperoxide, tertiary butyl hydroperoxide, dichloro peroxide, di-tertiary butyl peroxide, benzoyl peroxide, acetyl peroxide, lauroyl peroxide, and a compound having a structure as indicated below.

The content of the radical generator (A) is preferably from 1 to 100 wt %, more preferably from 1 to 40 wt % relative to the total amount of the polymer (B) having an aromatic carboxy group in the side chain and a polymerizable compound (C) which are described later.

The radical generator (A) used in the present invention may be used singly or in combination of two or more thereof.

[(B) Polymer Having an Aromatic Carboxy Group in the Side Chain]

The photosensitive layer in the present invention comprises a polymer (B) having an aromatic carboxy group in a side chain. The lithographic printing plate having a superior chemical resistance can be obtained by incorporating the component (B) therein.

The polymer (B) having an aromatic carboxy group in the side chain in the present invention is used as a binder polymer. The polymer (B) having an aromatic carboxy group in the side chain (hereinafter called 'binder polymer of component (B)') is a polymer having an after-mentioned aromatic carboxy group which may be bonded directly or through linking group in any position, preferably to the main chain thereof.

An aromatic carboxy group is an aromatic group having at least one carboxy group and is preferably a group represented by Formula (B-1).

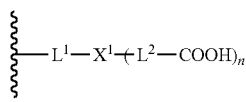

(B-1)

In formula (B-1), each of $L^1$ and $L^2$ denotes a divalent linking group, $X^1$ denotes an aromatic group, and n denotes an integer of 1 to 5.

Examples of $L^1$ include monovalent bond, alkylene group, —CO—, —COO—, (or —CO—), —CONH— (or —NHCO—), —NH—, —NHCONH— and a divalent liking group formed from the combination thereof. Among them, a divalent linking group having —CONH— (or —NHCO—) is preferable, and —CONH— is more preferable.

$L^2$ is preferably a monovalent bond or alkylene group having 1 to 5 carbons, among them, more preferably a monovalent bond.

Examples of $X^1$ include an aromatic hydrocarbon group and a heterocyclic aromatic group, and, among them, an aromatic group having 6 to 20 carbons is preferable, a phenyl group and a naphthyl group are more preferable, and a phenyl group is particularly preferable.

n denotes an integer of 1 to 5, preferably an integer of 1 to 3, and more preferably 1.

An aromatic carboxy group represented by Formula (B-1) preferably comprises —$C_6H_5$COOH, and more preferably is —$C_6H_5$COOH or —CONH—$C_6H_5$COOH.

The polymer (B) having an aromatic carboxy group in a side chain is preferably an alkali-soluble resin which causes the photosensitive layer developable in processing liquid of aqueous alkali solution. An alkali-soluble resin is a resin which is soluble in aqueous alkali solution, and specifically is preferably a resin having an alkaline-soluble group such as a carboxy group, a phenolic hydroxy group, a sulphonic acid group, a phosphonic group, an active imino group and an N-sulphonyl amide group.

Examples of such alkali-soluble resins include novolak resins or cresol resins such as phenol-formaldehide resins, cresol-formaldehide resins, phenol-cresol-formaldehyde co-condensation resins; polyhydroxystyrenes such as a polyhy droxystyrene, a polyhydroxystyrene halide; (meth)acryl type resins having one or more monomer units derived from a monomer having the above-mentioned alkali-soluble group; vinyl type polymers having such a structure as an active methylene group or a urea bond; polyurethane resins such as the polyurethane resin having a N-sulphonyl amide, a N-sulphonyl ureido group or a N-aminosulphonylamido group, the polyurethane resin having an active imino group and the polyurethane resin having a carboxy group; polyamide resins such as a polyhydroxy polyamide; polyester resins having a phenolic hydroxy group. As a binder polymer used in the present invention, (meth)acryl resins derived from a monomer having the above-mentioned alkali-soluble group is preferable, and (meth)acryl type resins having a carboxy group is more preferable.

A binder polymer used in the present invention is preferably a (meth)acryl resin having a monomer unit containing an aromatic carboxy group, and is more preferably a (meth)acryl type copolymer having a monomer unit containing a carboxy group in addition to an aromatic carboxy group.

Each monomer unit is described below.

The monomer unit containing an aromatic carboxy group is not particularly limited, and the monomer unit represented by Formula (B-2) is preferable.

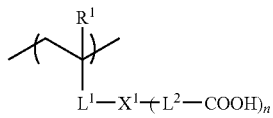

(B-2)

In Formula (B-2), $R^1$ denotes a hydrogen atom or a methyl group, and $L^1$, $L^2$, $X^1$ and n are the same as $L^1$, $L^2$, $X^1$ and n in Formula (B-1) and preferable ranges are also the same.

In the present invention, a monomer unit represented by Formula (B-2) is preferably a monomer unit derived from N-(4-carboxyphenyl)(meth)acrylamide.

The content of a monomer unit containing an aromatic carboxy group is preferably from 5 to 50 units, more preferably from 10 to 30 units, and yet more preferably from 10 to 25 units, taking the number of the total monomer units as 100. The superior developing property is obtained when the content is within the above range.

Furthermore, the binder polymer may have one or more types of monomer units containing an aromatic carboxy group.

The monomer units containing a carboxy group (including the salt thereof) is not particularly limited, and the monomer unit represented by Formula (B-3) is preferable.

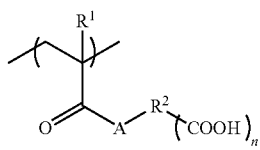

(B-3)

In Formula (B-3), $R^1$ denotes a hydrogen atom or a methyl group, $R^2$ denotes a linking group that includes two or more atoms selected from the group consisting of a carbon atom, a hydrogen atom, an oxygen atom, a nitrogen atom and a sulfur atom, and the total number of the atoms in the group is from 2 to 82, 'A' denotes an oxygen atom or —NR³—, R³ denotes a hydrogen atom or a monovalent hydrocarbon group having 1 to 10 carbons, and n denotes an integer of 1 to 5.

In Formula (B-3), the linking group represented by R² contains two or more atoms selected from the group consisting of a carbon atom, a hydrogen atom, an oxygen atom, a nitrogen atom, and a sulfur atom, and the total number of the atoms in the linking group is from 2 to 82, preferably from 2 to 50, and more preferably from 2 to 30. The linking group represented by R² may have a substituent. If the linking group has one or more substituents, the total number of atoms includes the number of atoms in the substituent(s). More specifically, the number of atoms that constitutes the main skeleton of the linking group represented by R² is preferably from 1 to 30, more preferably from 3 to 25, yet more preferably from 4 to 20, and most preferably from 5 to 10. The term 'main skeleton of the linking group' refers to an atom or an atomic group used only for linking 'A' and the COOH group at the end in Formula (B-3). When there are two or more linking routes, the "main skeleton of the linking group" refers to an atom or an atomic group that constitutes the shortest route that links 'A' and the COOH group at the end. Accordingly, when the linking group includes a cyclic structure therein, the number of the atoms to be counted in may change depending on the linking position thereof (e.g., ortho, meta, or para).

More specifically, the linking group represented by R² in Formula (B-3) includes an alkylene group, a substituted alkylene group or a group having a valence of (n+1) obtained by removing hydrogen atoms from optional carbons that constitute these groups, and a structure in which two or more of these groups are linked via an amide or ester bond is preferable. In particular, the linking group preferably contains 5 to 10 carbons in the main skeleton of the linking group, and structurally has a chain structure preferably including an ester bond or the above-mentioned cyclic structure.

A substituent group which can be introduced into the linking group represented by R² includes a monovalent non-metal atomic group excluding a hydrogen, and examples thereof include a halogen atom (—F, —Br, —Cl, —I), hydrocarbon group (alkyl group, allyl group, alkenyl group, alkynyl group), alkoxy group, aryloxy group.

'A' in Formula (B-3) denotes preferably an oxygen atom or —NH— from the viewpoint of ease of synthesis.

'n' in Formula (B-3) denotes an integer of 1 to 5 and preferably 1 from the viewpoint of plate life.

Specific examples of the monomer unit containing a carboxy group include the compounds illustrated in (a-1) to (a-11) below.

a-1 a-2

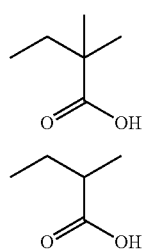

a-3

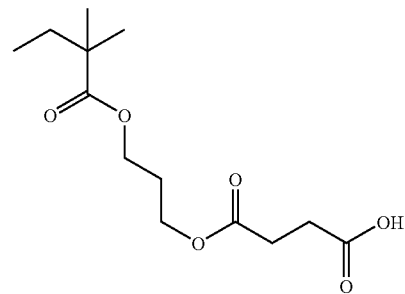

a-4

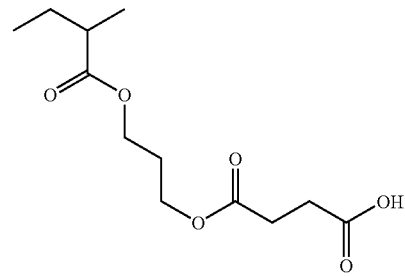

a-5

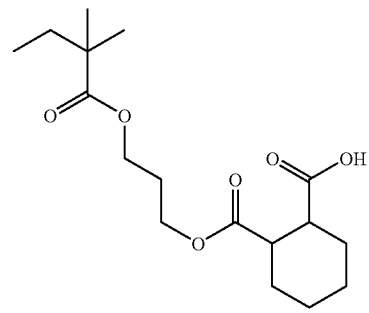

a-6

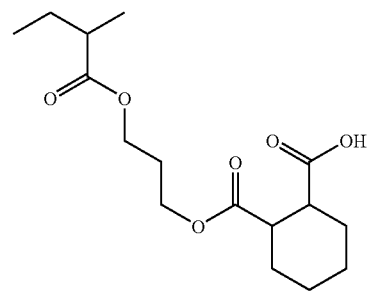

a-7

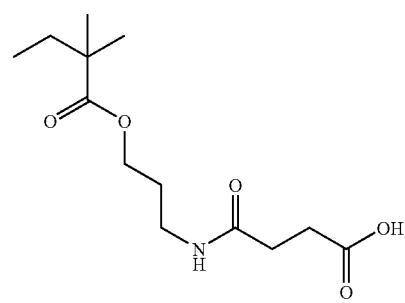

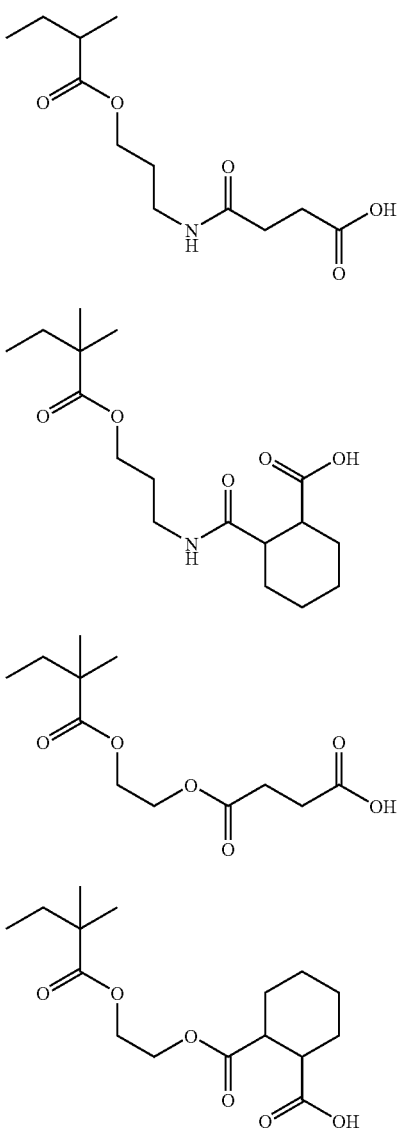

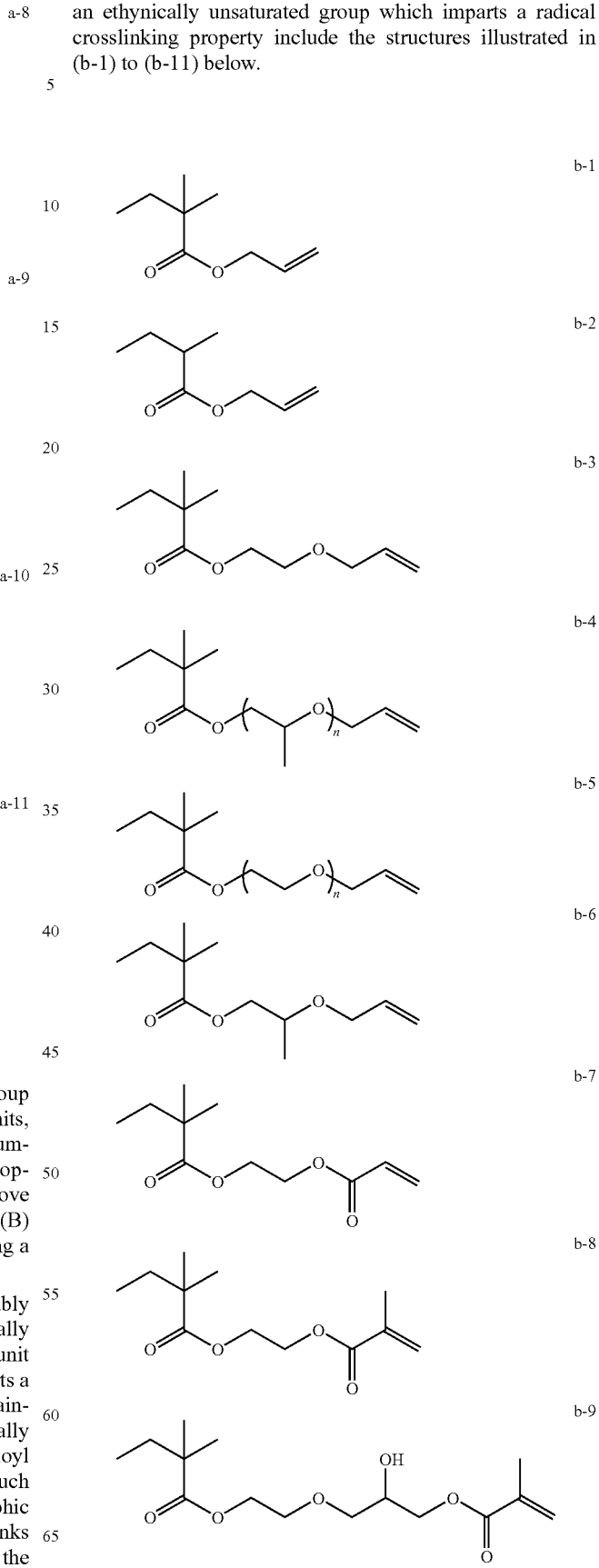

Specific examples of the monomer unit containing at least an ethynically unsaturated group which imparts a radical crosslinking property include the structures illustrated in (b-1) to (b-11) below.

The content of a monomer unit containing a carboxy group is not more than 50 units, preferably not more than 40 units, and more preferably not more than 30 units, taking the number of the total monomer units as 100. The superior developing property is obtained when the content is within the above range. Furthermore, the binder polymer of the component (B) may have one or more types of monomer units containing a carboxy group.

The binder polymer of the component (B), may preferably further have a monomer unit containing at least an ethynically unsaturated group. Suitable examples of a monomer unit containing an ethynically unsaturated group which imparts a radical crosslinking property include monomer units containing in the side chain at least a polymerizable ethynically unsaturated group such as an acryloyl group, a methacryloyl group and an aryl group. The binder polymer having such monomer units improves the plate life of the lithographic printing plate to be obtained since the binder resin crosslinks with the polymerizable compound (C) and increases the crosslinking density.

-continued

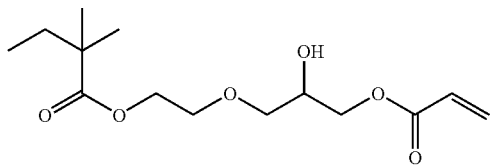

b-10

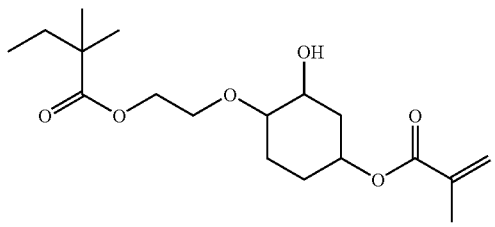

b-11

The content of a monomer unit containing at least an ethynically unsaturated group which imparts a radical crosslinking property is from 5 to 50 units, preferably from 10 to 40 units, and more preferably from 15 to 35 units, taking the number of the total monomer units as 100. The superior plate life is obtained when the content is within the above range. Furthermore, the binder polymer of the component (B) may have one or more types of monomer units containing at least an ethynically unsaturated group which imparts a radical crosslinking property.

The binder polymer of the component (B) may preferably further have a cyano group in the side chain. The binder polymer having a cyano group improves the chemical resistance of the lithographic printing plate to be obtained. The binder polymer of the component (B) may preferably have a monomer unit containing a cyano group.

Examples of the cyano group-containing monomers constituting the monomer units containing a cyano group include (meth)acrylonitrile; (meth)acrylic esters such as cyanomethyl (meth)acrylate, 2-cyanoethyl (meth)acrylate, cyanopropyl (meth)acrylate, 1-cyanomethylethyl (meth)acrylate, 2-cyanopropyl (meth)acrylate, 1-cyanocyclopropyl (meth) acrylate, 1-cyanocycloheptyl (meth)acrylate, 1,1-dicyanoethyl (meth)acrylate, 2-cyanophenyl (meth)acrylate, 3-cyanophenyl (meth)acrylate, 4-cyanophenyl (meth)acrylate, 3-cyanobenzyl (meth)acrylate and 4-cyanobenzyl (meth) acrylate; vinyl esters such as cyano vinyl acetate and vinyl 1-cyano-1-cyclopropane carbonate; allyl esters such as allyl cyanoacetate and allyl 1-cyano-1-cyclopropane carbonate; (meth)acrylamides such as N,N-dicyano methyl(meth)acrylamide and N-cyanophenyl(meth)acrylamide; vinyl ethers such as cyanomethyl vinyl ether, 2-cyanoethyl vinyl ether, 3-cyanobenzyl vinyl ether and 4-cyanobenzyl vinyl ether; allyl ethers such as allyl cyano methyl ether, allyl-2-cyanoethyl ether, allyl-3-cyanobenzyl ether and allyl-4-cyanobenzyl ether; and, among them, (meth)acrylnitrile is preferable, and acrylnitrile is more preferable.

The content of a monomer unit containing a cyano group is from 5 to 80 units, preferably from 20 to 80 units, and more preferably from 30 to 70 units, taking the number of the total monomer units as 100. The superior chemical resistance is obtained when the content is within the above range. Furthermore, the binder polymer of the component (B) may have one or more types of monomer units containing a cyano group.

For the purpose of maintaining a developing property of the photosensitive layer, a binder polymer of the component (B) preferably has an appropriate molecular weight, more preferably has a weight-average molecular weight of from 5,000 to 300,000, and particularly preferably has a weight-average molecular weight of from 10,000 to 150,000.

The content of the polymer (B) having an aromatic carboxy group in the side chain is preferably from 20 to 70 wt % relative to the solid content of the photosensitive layer. When the content is within the above range, curing proceeds sufficiently, giving the image area having an excellent strength and curing efficiency is high. Two or more kinds of polymers having an aromatic carboxy group in the side chain may be used in combination as necessary.

(C) Polymerizable Compound

The polymerizable compound (C) in the present invention is preferably an ethylenically unsaturated compound, more preferably a monomer or an oligomer containing at least one or preferably at least two addition-polymerizable ethylenically unsaturated groups per molecule and, yet more preferably one having a boiling point of 100° C. or higher under normal pressure.

Examples of such monomers or oligomers include monofunctional (meth)acrylates (hereinafter methacrylate and acrylate are collectively also called (meth)acrylate) such as polyethylene glycol mono(meth)acrylate, polypropylene glycol mono(meth)acrylate and phenoxyethyl(meth)acrylate; multifunctional (meth)acrylates such as polyethylene glycol di(meth)acrylate, polypropylene glycol di(meth)acrylate, trimethylolpropane tri(meth)acrylate, neopentyl glycol di(meth)acrylate, pentaerythritol tri(meth)acrylate, pentaerythritol tetra(meth)acrylate, dipentaerythritol hexa(meth) acrylate, hexanediol di(meth)acrylate, tri(acryloyloxy ethyl) isocyanurate, (meth)acrylate of the addition product from polyvalent alcohol and alkyleneoxide, (meth)acrylate of the addition product from polyvalent phenol and alkyleneoxide, urethane acrylates, polyester acrylates, epoxyacrylates formed by addition of (meth)acrylic acid to epoxy resin; multifunctional allyl compounds such as allyl isocyanurate and ally cyanurate.

The content of the polymerizable compound (C) is preferably in the range of from 5 to 60 wt % relative to the total solid content of nega type photosensitive composition. When the content of the polymerizable compound (C) is less than 5 wt %, curing becomes insufficient. When the content of the polymerizable compound (C) exceeds 60 wt %, the photosensitive layer of the obtained nega-type photosensitive lithographic printing plate becomes sticky. A plurality of polymerizable compounds (C) may be combined as necessary.

(D) Infrared Absorber

The infrared absorber used in the present invention has functions of converting absorbed infrared rays to heat, and generating excited electrons. Upon absorption of light, the infrared absorber acts on the compound (A) that generates a radical upon the application of light or heat, causing the compound (A) to decompose to generate a radical.

The infrared absorber used in the present invention is preferably a dye or a pigment having an absorption maximum at the wavelength of 760 to 1,200 nm.

As the dyes, there can be used commercially available products or other known dyes disclosed in, for example, Senryo Binran (Dye Handbook), edited by The Society of Synthetic Organic Chemistry, Japan, published in 1970. Specific examples thereof include azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium salts, and metal thiolate complexes, and the like.

Preferable examples of the dyes include cyanine dyes disclosed in JP-A-58-125246, JP-A-59-84356, JP-A-59-202829, JP-A-60-78787 and the like; methine dyes disclosed in JP-A-58-173696, JP-A-58-181690, JP-A-58-194595 and the like; naphthoquinone dyes disclosed in JP-A-58-112793, JP-A-58-224793, JP-A-59-48187, JP-A-59-73996, JP-A-60-52940, JP-A-60-63744 and the like; squarylium dyes disclosed in JP-A-58-112792; and cyanine dyes disclosed in U.K. Patent No. 434,875 and the like.

Furthermore, near infrared ray absorption sensitizers disclosed in U.S. Pat. No. 5,156,938 may also be suitably used, and substituted arylbenzo(thio)pyrylium salts disclosed in U.S. Pat. No. 3,881,924, trimethine thiapyrylium salts disclosed in JP-A-57-142645 (U.S. Pat. No. 4,327,169), pyrylium type compounds disclosed in JP-A-58-181051, JP-A-58-220143, JP-A-59-41363, JP-A-59-84248, JP-A-59-84249, JP-A-59-146063 and JP-A-59-146061, cyanine dyes disclosed in JP-A-59-216146, pentamethine thiopyrylium salts disclosed in U.S. Pat. No. 4,283,475, and pyrylium salts disclosed in JP-B-5-13514 and JP-B-5-19702 are preferably used. Other preferable examples of the dyes include near infrared ray absorption dyes represented by Formula (I) or (II) described in U.S. Pat. No. 4,756,993.

Among them, a cationic dye is preferable and a cationic sensitizing dye is more preferable.

Specific examples of dyes (S-1) to (S-14) as the infrared absorbers are shown below, but the present invention is not limited thereto. Incidentally, Me denotes a methyl group, Et denotes an ethyl group and Ph denotes a phenyl group in the specific examples below.

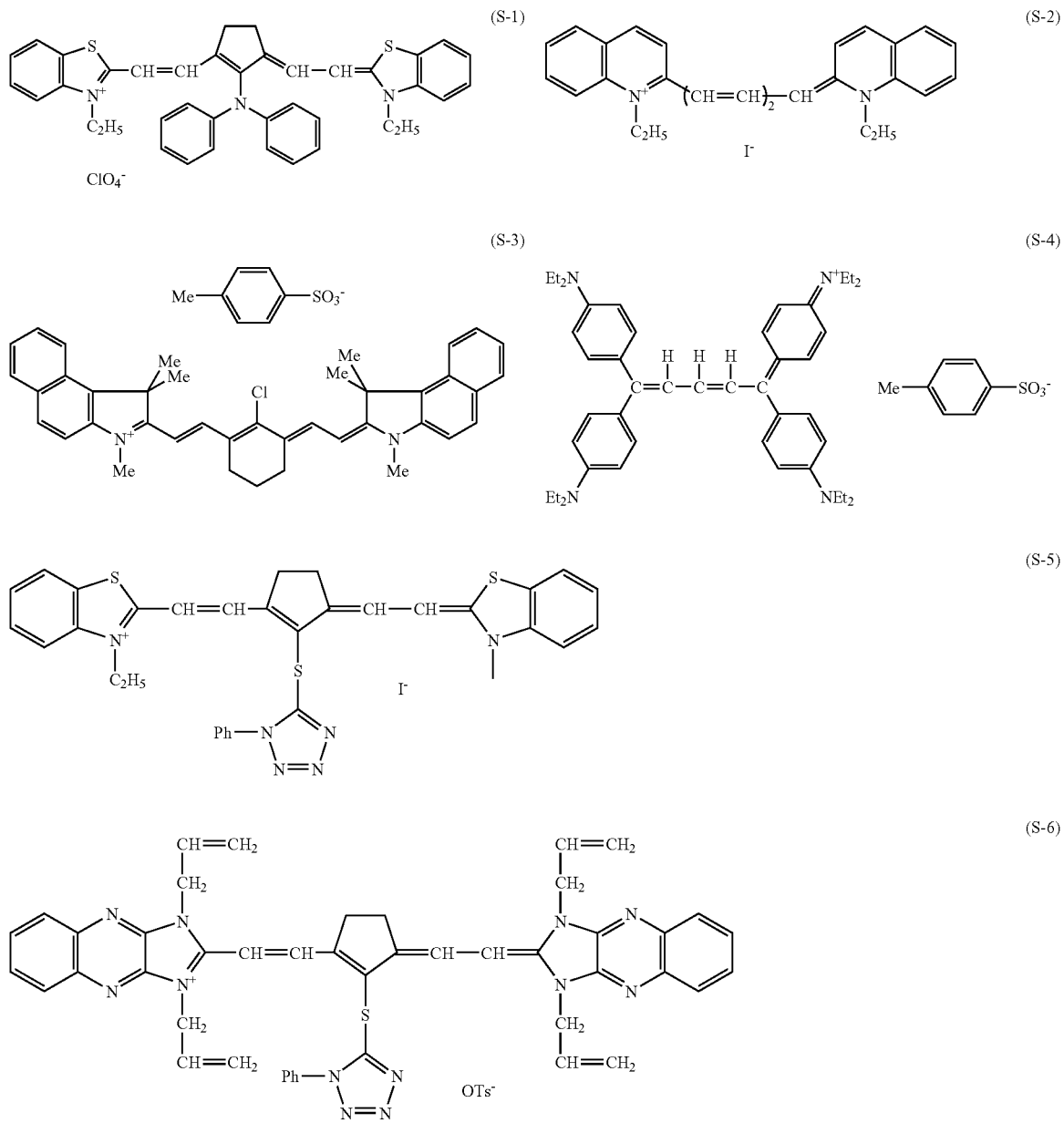

-continued
(S-7)
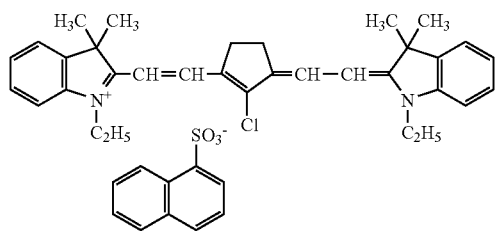
(S-8)
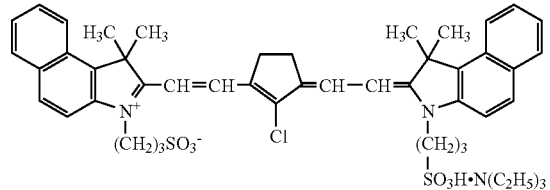
(S-9)
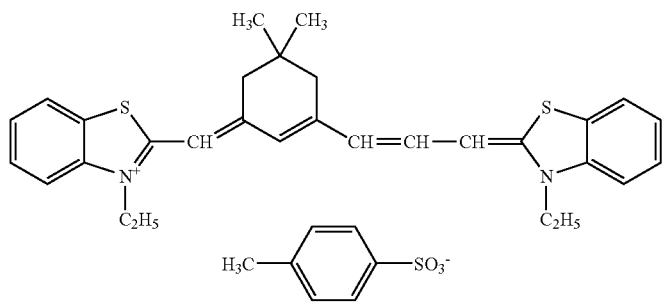
(S-10)
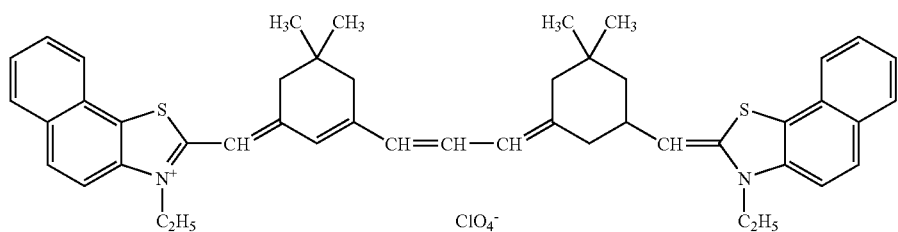
(S-11)
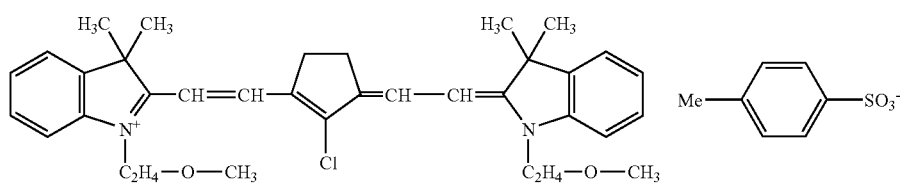
(S-12)
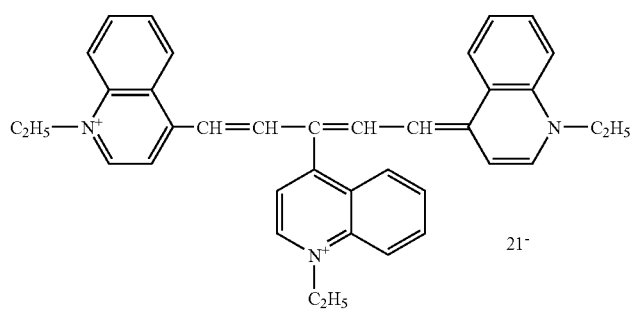
(S-13)
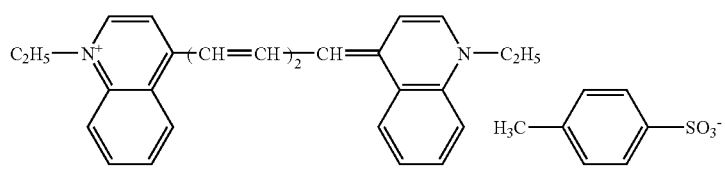
(S-14)
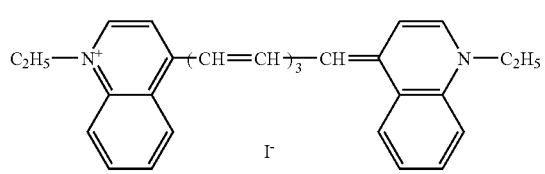

Furthermore, there may also be used the infrared absorbers having an above-mentioned organic boron anion which substitutes any one of the counter anions of infrared absorbers (cationic sensitizing dyes) illustrated above.

These dyes may be used singly or in combination of two or more thereof.

The content of the dye as the infrared absorber in the photosensitive layer is preferably from about 3 to 300 mg, more preferably from 10 to 200 mg per 1 $m^2$ of the photosensitive layer.

As the pigment that is used in the present invention, commercially available pigments and pigments described in Color Index (C.I.) Handbook; Saishin Ganryo Binran (Current Pigment Handbook), compiled by Nippon Ganryo Pigment Kyokai (1977); Saishin Ganryo Ohyo Gijutsu (Current Pigment Application Technologies), published by CMC Publishing Co., Ltd. (1986); and Insatsu Inki Gijutsu (Printing Ink Technologies), published by CMC Publishing Co., Ltd. (1984) can be applied.

Examples of the pigment include black pigments, yellow pigments, orange pigments, brown pigments, red pigments, violet pigments, blue pigments, green pigments, fluorescent pigments, metal powder pigments, and other polymer-binding dyes. Specific examples include insoluble azo pigments, azo lake pigments, condensed azo pigments, chelate azo pigments, phthalocyanine based pigments, anthraquinone based pigments, perylene based pigments, perinone based pigments, thioindigo based pigments, quinacridone type pigments, dioxazine based pigments, isoindolinone based pigments, quinophthalone based pigments, dyeing lake pigments, azine pigments, nitroso pigments, nitro pigments, natural pigments, fluorescent pigments, inorganic pigments, and carbon black.

These pigments may be used with or without a surface treatment.

The methods of the surface treatment include methods of coating a resin or wax onto the surface, applying a surfactant, binding a reactive substance (e.g., a silane coupling agent, epoxy compound, polyisocyanate, and the like) to the pigment surface, and the like. The above mentioned surface treatment methods are described in Kinzoku Sekken No Seishitsu To Ohyo (Properties and Applications of Metallic Soaps), published by Saiwai Shobo; Insatsu Inki Gijutsu (Printing Ink Technologies), published by CMC Publishing Co., Ltd. (1984); and Saishin Ganryo Ohyo Gijutsu (Current Pigment Application Technologies), published by CMC Publishing Co., Ltd. (1986).

The particle size of the pigment is preferably in the range of from 0.01 µm to 10 µm, more preferably in the range of from 0.05 µm to 1 µm, and yet more preferably in the range of from 0.1 µm to 1 µm. When the particle size is within this preferable range, excellent dispersion stability of the pigment in the photosensitive composition is obtained, and furthermore a uniform photosensitive layer is obtained when it is applied to a lithographic printing plate precursor.

As a method of dispersing the pigment, known dispersion techniques that are used in the ink production or toner production can be employed. Examples of dispersion machines include an ultrasonic dispersion machine, a sand mill, an attritor, a pearl mill, a super mill, a ball mill, an impeller, a disperser, a KD mill, a colloid mill, a dynatron, a three-roll mill, and a pressure kneader. The details are described in Saishin Ganryo Ohyo Gijutsu (Current Pigment Application Technologies), published by CMC Publishing Co., Ltd. (1986).

The content of the infrared absorber is preferably from 0.01 to 50 wt %, and more preferably from 0.1 to 10 wt % based on the whole of solids constituting the photosensitive layer from the viewpoints of uniformity in the photosensitive layer and durability when added in the photosensitive layer.

In addition to the above-mentioned essential components (A) to (D), other components can be added in the photosensitive layer as appropriate according to the intended use and the production method. Other preferred components are exemplified below.

Thermal Polymerization Inhibitor

The above-mentioned photosensitive layer preferably contains a small amount of a thermal polymerization inhibitor in order to inhibit undesired thermal polymerization of the compound having a polymerizable ethylenically unsaturated bond, that is, polymerizable compound (C) during the production process of the photosensitive layer or the storage of the lithographic printing plate precursor.

Examples of the suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (I) salt of N-nitrosophenylhydroxylamine.

The addition amount of the thermal polymerization inhibitor in the photosensitive layer is preferably in the range of from 0.01 to 5 wt % based on the total weight of solids in the photosensitive layer.

Furthermore in order to avoid polymerization inhibition due to oxygen, a higher fatty acid derivative, for example, behenic acid or behenic amide may be added and allowed to localize on the photosensitive layer surface during the drying step after the coating, as necessary.

The addition amount of the higher fatty acid derivative in the photosensitive layer is preferably in the range from 0.5 to 10 wt % based on the total weight of solids in the photosensitive layer.

Coloring Agent

Furthermore, a dye or pigment may be added to the photosensitive layer for the purpose of coloring of the photosensitive layer. The plate-checking property of the printing plate, such as visibility after plate-making and compatibility with an image densitometer, can thereby be improved.

The coloring agent is preferably a dye or a pigment. Specific examples of the colorant include pigments such as phthalocyanine type pigments, azo type pigments, carbon black or titanium oxide, and dyes such as Ethyl Violet, Crystal Violet, azo dyes, anthraquinone type dyes or cyanine dyes.

The amount of a dye and a pigment to be added in the photosensitive layer as a colorant is preferably in a range of 0.5 to 5 wt % based on the total solid content in the photosensitive layer.

Furthermore, in the case of a dye, preferably it does not have a halogen ion as a counter-anion.

Other Additives

Furthermore, there may be used, in the photosensitive layer, additives for giving various properties, such as an oxygen-removing agent such as phosphine, phosphonate or phosphite, a reducing agent, a color-fading inhibitor, a surfactant, a plasticizer, an antioxidant, an ultraviolet absorbing agent, an antifungal agent and an antistatic agent, in accordance with purpose.

Furthermore other known additives, such as inorganic fillers for improving physical properties of the cured films, a plasticizer and an oleosensitizer for improving the ink receptivity of the surface of photosensitive layer may also be added.

Examples of plasticizers include dioctyl phthalate, didodecyl phthalate, triethylene glycol dicaprate, dimethyl glycol phthalate, tricresyl phosphate, dioctyl adipate, dibutyl cebacate, and triacetylglycerin.

The amount of the plasticizers in the photosensitive composition is preferably 10 wt % or less, relative to the total weight of the polymer (B) having an aromatic carboxy group in the side chain and the polymerizable compound (C).

An ultraviolet ray (UV) initiator, a thermally crosslinking agent and the like may also be added in order to enhance the effects of heating and exposing to light after development for the purpose of improving the film strength (plate life), which will be detailed later.

Furthermore, in order to promote the polymerization, a polymerization promoter or a chain transfer agent such as amines, thiols and disulfides can be added. Specific examples thereof include N-phenylglycine, triethanolamine, and N,N-diethylaniline.

Lithographic Printing Plate Precursor

A lithographic printing plate precursor used in the present invention comprises, above a support, a photosensitive layer (a negative recording layer) comprising a compound (A) that can generate a radical upon the application of light or heat, a polymer (B) having an aromatic carboxy group in a side chain, (C) a polymerizable compound and (D) an infrared absorber. It may furthermore comprises other layers such as an interlayer (undercoat layer) as necessary.

Each element constituting the lithographic printing plate precursor used in the present invention will be explained below.

Photosensitive Layer

The photosensitive layer (negative recording layer) in the present invention has the image-formation mechanism described below. Specifically, infrared rays absorbed by the infrared absorber (D) are converted to heat. Due to the heat generated at this time and/or light, radicals are generated from the compound (A) that can generate a radical upon the application of light or heat. Then the generated radicals are used as an initiator to cause chain polymerization reaction of the polymerizable compound (C), so that the photosensitive layer is cured. Since the polymer (B) having an aromatic carboxy group in a side chain is used as a binder polymer in the present invention, the formed film has a hydrophobic property and a surface having good development resistance to give a cured film having superior property.

Thus, the photosensitive layer having components (A) to (D) in the present invention is excellent in plate life and chemical resistance.

The photosensitive layer in the present invention can be provided by dissolving the components (A) to (D) in any of various organic solvents and coating the liquid onto the support or the interlayer (undercoat layer) described later.

Example of the solvents used here include dioxane, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. These solvent may be used singly or in a mixture of two or more thereof. Appropriate solid content of the coating liquid is from 2 to 50 wt %.

It is preferable that the coating amount (thickness) of the photosensitive layer is determined appropriately depending on intended purposes since it may mainly affect the sensitivity and developability of the photosensitive layer and the strength and plate life of the light-exposed film.

From the viewpoints of plate life and sensitivity, the preferable coating amount of the photosensitive layer is from 0.1 to 10 $g/m^2$ by weight after drying, and more preferably from 0.5 to 5 $g/m^2$.

Support

As the support used in the present invention, the heretofore known support used for lithographic printing plate precursors, preferably hydrophilic support can be used without particular limitations.

The support used is preferably a dimensionally stable plate-shaped material. Examples thereof include paper, paper laminated with a plastic material (e.g., polyethylene, polypropylene, or polystyrene), metal sheets (e.g., of aluminum, zinc, or copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal), paper or plastic films laminated with a metal selected from the above metals, and paper or plastic films on which a metal selected from the above metals is vapor-deposited.

Any of appropriate known physical or chemical treatments may be applied to the surface of the support for the purpose of providing hydrophilic property or increasing strength thereof as necessary.

Preferred support is preferably a sheet of paper, a polyester film, or an aluminum sheet. Among these, more preferred is an aluminum sheet which is dimensionally stable and relatively cost efficient, and the surface thereof can be modified to have favorable hydrophilicity and strength by a surface treatment as needed. In addition, composite sheets such as those disclosed in JP-B-48-18327, wherein an aluminum sheet is laminated on a polyethylene terephthalate film, are also preferable.

The aluminum sheet as referred to herein means a dimensionally stable metal plate containing aluminum as a main component, and examples thereof include a pure aluminum plate, an alloy plate containing aluminum as a main component as well as a trace amount of element(s) other than aluminum, and a sheet of plastic or paper onto which aluminum or an aluminum alloy is laminated or vapor-deposited. In the following, the above-mentioned supports made of aluminum or aluminum alloy are collectively referred to as an aluminum support. Examples of the elements other than aluminum that may be contained in the aluminum alloy include silicon, iron, manganese, copper, magnesium, chromium, zinc, bismuth, nickel and titanium. The content of such element(s) in the alloy is 10 wt % or less. Although the support in the present invention is most preferably a pure aluminum support, the aluminum sheet in the present invention may contain a trace amount of element(s) other than aluminum, since it is difficult to produce completely pure aluminum because of problems accompanying a purifying process. As described above, the composition of the aluminum sheet used in the present invention is not particularly limited, and any aluminum plates which are known and used in the art, for example, those satisfying the standards stipulated in JIS A1050, A1100, A3103, or A3005, may be appropriately used.

The thickness of the aluminum support used in the present invention may be appropriately adjusted according to the sizes of printing machine and printing plate and the user needs. The thickness is preferably 0.25 to 0.55 mm, more preferably 0.3 to 0.50 mm, from the viewpoints of handling and prevention of the jamming in a CTP exposure apparatus.

Furthermore, the aluminum supports suitable for the present invention preferably have the following surface profile.

Surface Profile of Aluminum Support

The aluminum support in the present invention preferably has the factors of surface profile, Ra, ΔS, and a45, respectively satisfying the following conditions (i) to (iii).
(i) Ra: 0.2 to 0.40 μm
(ii) ΔS: 35 to 85%
(iii) a45: 25 to 55%

Here, Ra denotes a surface roughness.

ΔS is a value calculated from a real area $S_x$ obtained by approximate three-point method and a geometrically determined area $S_0$ according to the following equation.

$$\Delta S(\%) = (S_x - S_0)/S_0 \times 100$$

a45 denotes the area rate of the area having an inclination angle of 45° or more, which is obtained by extracting the component having a wavelength of from 0.2 μm to 2 μm.

A detailed explanation of the surface profile is given below.

(i) Ra denotes a surface roughness. Here, the surface roughness (Ra) of the aluminum support as referred to herein means a center line average roughness (arithmetic average roughness) in the direction perpendicular to the rolling direction of aluminum and is expressed by a value (unit: μm) given by the following equation when a portion of the measurement length L is taken out in the center line direction from a roughness curve measured using a profilometer, the center line of the thus taken out portion is defined as an X-axis, whereas the axis perpendicular to the X-axis is defined as a Y-axis, and a roughness curve is expressed by Y=f(X). (The determination of L and the measurement of average roughness are according to JIS B0601.)

$$Ra = \frac{1}{L} \int_0^L |f(X)| dX$$

In general, for the sake of enhancing the water holding property, it is effective to increase the surface roughness. However, if the surface roughness is increased, deep concaves are liable to be locally formed, and the deep concaves cause a development defect, thereby likely generating dotted residual films. Accordingly, it is preferable that Ra is within the following range.

That is, Ra is preferably in the range of from 0.20 to 0.40 μm, more preferably in the range of from 0.20 to 0.35 μm, and yet more preferably in the range of from 0.25 to 0.35 μm.

As described below in detail, ΔS is calculated from a real area $S_x$, which is determined by approximate three-point method from three-dimensional data obtained by measuring a 50×50 μm support surface at 512×512 points by using the atomic force microscope, and a geometrically determined area (apparent area) $S_0$ according to the following equation.

$$\Delta S(\%) = (S_x - S_0)/S_0 \times 100$$

The surface area ratio ΔS is a factor showing a degree of increase in the real area $S_x$ by the roughing treatment relative to the geometrically determined area $S_0$.

With the increase in ΔS, the contact area to the negative recording layer becomes larger, consequently the plate life improves. Therefore, ΔS is preferably in the following range.

That is, ΔS is preferably in the range of from 35 to 85% and is more preferably in the range of from 40 to 85%, and yet more preferably in the range of from 40 to 80%.

As described below in detail, a45 denotes an area rate of the area having an inclination angle of 45° or more (steepness), which is obtained by extracting the components having a wavelength of from 0.2 μm to 2 μm from the three-dimensional data determined by 512×512 point-measuring in an area of 50×50 μm of the surface of the support using an atomic force microscope.

The degree of steepness is a factor expressing a degree of sharpness of the fine shape of the surface of the support. Specifically, the degree of steepness denotes a proportion of an area having an inclination of a certain angle or more to the real area in irregularities of the surface of the support.

For improvement in adhesiveness between the photosensitive layer and the support and thus in plate life, the rate of the area having an inclination angle of 45° or more (steepness), a45, is preferably greater. On the other hand, the rate of the area having an inclination angle of 45° or more (steepness), a45, is preferably smaller for suppressing inking on non-image areas and improving contamination resistance. Accordingly, a45 is preferably in the following range.

That is, a45 is preferably in the range of from 25 to 55%, more preferably in the range of from 30 to 55%, and yet more preferably in the range of from 30 to 50%.

ΔS and a45 of the aluminum support in the present invention are determined by the following methods.

(1) Measurement of Surface Profile by Atomic Force Microscope

In the present invention, in order to determine ΔS and a45, first of all, the surface profile is measured by an atomic force microscope (AFM) to determine three-dimensional data.

The measurement can be, for example, carried out under the following conditions. That is, the aluminum support is cut out into a size of 1 cm square and set on a horizontal sample table on a piezo scanner; a cantilever is brought closer enough to the surface of the sample that an atomic force is actuated, the sample is scanned in the XY-direction; and during this time, irregularities of the samples are caught by a displacement of the piezo in the Z-direction. As the piezo scanner, one capable of scanning 150 μm in the XY-direction and 10 μm in the Z-direction is used. As the cantilever, one having a resonance frequency of from 120 to 150 kHz and a spring constant of from 12 to 20 N/m (SI-DF20, manufactured by NANOPROBE) is used, and the measurement is carried out at the dynamic force mode (DFM). Also, by subjecting the determined three-dimensional data to least square approximation, a slight inclination is corrected to determine a reference plane.

In the measurement, the surface of 50×50 μm is subjected to 512×512 point-measurement. The resolution in the XY-direction is set up at 1.9 μm, the resolution in the Z-direction is set up at 1 nm, and the scanning rate is set up at 60 μm/sec.

(2) Correction of Three-Dimensional Data

In calculating ΔS, the three-dimensional data determined above in (1) are employed as they are. In calculating a45, data corrected by eliminating components having a wavelength of from 0.2 μm to 2 μm from the three-dimensional data are employed. By this correction, in the case where the surface having deep irregularities as in supports to be used in lithographic printing plate precursors is scanned by a probe of AFM, it is possible to eliminate noises generated when the probe touches the edge portion of a convex and jumps, or when a portion other than the tip of the probe contacts the side wall of a deep concave.

The correction is carried out by subjecting the three-dimensional data determined above in (1) to fast Fourier transformation to determine a frequency distribution and then eliminating components having a wavelength of from 0.2 μm to 2 μm therefrom to achieve Fourier inverse transformation.

(3) Calculation of Respective Factors

Calculation of ΔS

Using the three-dimensional data (f(x,y)) determined above in (1), three points adjacent to each other are extracted, and the total sum of areas of minute triangles is determined and defined as a real area $S_x$. The surface area ratio ΔS is determined from the resulting real area $S_x$ and geometric measurement area $S_0$ and according to the following equation. $S_0$ denotes a geometric measurement area and is determined by $S_0=L_x \times L_y$, in the present invention, $L_x=L_y=50$ μm.

$$\Delta S(\%)=(S_x-S_0)/S_0 \times 100$$

Calculation of a45

Using the three-dimensional data (f(x,y)) obtained by correction above in (2), three points adjacent to each other are extracted, and an angle between a minute triangle formed by these three points and the reference plane is calculated with respect to all data, to determine a distribution curve of degree of inclination. On the other hand, the total sum of areas of the minute triangles is determined and defined as a real area. A proportion a45 of a part having a degree of inclination of 45° or more to the real area is calculated from the distribution curve of degree of inclination.

In the present invention, the aluminum support having the above-mentioned surface profile can be prepared by subjecting to a surface treatment described later.

Treatments to be applied to the aluminum support will be described below.

Surface Roughing Treatment

Examples of the surface roughing treatment include mechanical roughing, chemical etching, and electrolytic graining as disclosed in JP-A-56-28893. Furthermore, an electrochemical roughing method of performing electrochemical roughing in a hydrochloric acid or nitric acid electrolytic liquid, and mechanical roughing treatments such as a wire brush graining method of scratching the aluminum surface using a metallic wire, a ball graining method of sand blasting the aluminum surface using polishing spheres and a polishing agent, and a brush graining method of roughing the surface using a nylon brush and a polishing agent can be employed. The above-mentioned roughing methods can be employed singly or in combination thereof.

Among them, the useful method for such surface roughening is the electrochemical method wherein the surfaces are roughened chemically in a hydrochloric or nitric acid electrolyte. In such a case, suitable amount of electricity applied to the anode is in the range of 50 C/dm² to 400 C/dm². More specifically, it is preferable that alternating current and/or direct current electrolysis is carried out in an electrolytic liquid containing from 0.1 to 50% of hydrochloric acid or nitric acid under conditions at a temperature of from 20° C. to 80° C. for a time of from one second to 30 minutes and at a current density of from 10 A/dm² to 50 A/dm².

The aluminum support thus surface-roughened may be chemically etched with an acid or an alkali.

Examples of etching agents that are suitably used include sodium hydroxide, sodium carbonate, sodium aluminate, sodium metasilicate, sodium phosphate, potassium hydroxide, and lithium hydroxide. The concentration and the temperature are preferably in the range of from 1 to 50% and in the range of from 20 to 100° C., respectively.

For the sake of removing stains (smuts) remaining on the surface after etching, acid washing is carried out. Examples of acids to be used include nitric acid, sulfuric acid, phosphoric acid, chromic acid, hydrofluoric acid, and borofluoric acid.

In particular, as the method of removing smuts after the electrochemical surface roughing treatment, a method of bringing into contact with sulfuric acid of from 15 to 65 wt % at a temperature of from 50 to 90° C. as described in JP-A-53-12739 and a method of performing alkali etching as described in JP-B-48-28123 are preferable.

The method and conditions are not particularly limited thereto so far as after the treatment, Ra, ΔS and a45, all of which are a factor of the surface shape of the treated surface, are satisfied with the conditions (i) to (iii) described above.

Anodic Oxidation Treatment

The thus surface-roughed aluminum support having an oxide layer formed thereon is then subjected to an anodic oxidation treatment.

In the anodic oxidation treatment, an aqueous solution of sulfuric acid, phosphoric acid, oxalic acid, or boric acid/sodium borate is used singly or in combinations as the major component of an electrolytic bath. In this case, as a matter of course, the electrolytic liquid may contain components that are at least usually contained in an Al alloy plate, electrodes, city water, ground water, etc. Furthermore, second or third components may be added to the electrolytic liquid. Examples of the second or third components as referred to herein include cations such as metal ions of Na, K, Mg, Li, Ca, Ti, Al, V, Cr, Mn, Fe, Co, Ni, Cu, Zn and an ammonium ion; and anions such as a nitric acid ion, a carbonic acid ion, a chlorine ion, a phosphoric acid ion, a fluorine ion, a sulfurous acid ion, a titanic acid ion, a silicic acid ion and a boric acid ion. These second or third components may be contained in a concentration of from about 0 to 10,000 ppm. With respect to the conditions of the anodic oxidation treatment, the quantity of an anodically oxidized film prepared by the treatment is preferably in the range of from 0.5 to 10.0 g/m², and more preferably in the range of from 1.0 to 5.0 g/m².

Furthermore, in general, the anodic oxidation treatment is preferably carried out by direct current or alternating current electrolysis in a concentration of the acid as the major component in the electrolytic liquid of from 30 to 500 g/L at a treatment liquid temperature of from 10 to 70° C. at a current density in the range of from 0.1 to 40 A/m².

Hydrophilization Treatment

As the hydrophilization treatment of the surface of the above-mentioned support, known methods can be widely applied. As an especially preferable treatment, the surface of the support is subjected to a hydrophilization treatment with a silicate or polyvinyl phosphonic acid, etc.

The film is preferably formed in an amount of from 2 to 40 mg/m², and more preferably from 4 to 30 mg/m² in terms of an element amount of Si or P. The coating amount can be measured by the fluorescent X-ray analysis method.

The above-mentioned hydrophilization treatment can be, for example, carried out by dipping the aluminum support having an anodically oxidized film formed thereon in an aqueous solution containing from 1 to 30 wt %, and preferably from 2 to 15 wt % of an alkali metal silicate or polyvinyl phosphonic acid at a pH of from 10 to 13 (determined at 25° C.) for example preferably at 15 to 80° C. for 0.5 to 120 seconds.

Examples of the alkali metal silicate that is used in the above-mentioned hydrophilization treatment include sodium silicate, potassium silicate, and lithium silicate.

Examples of a hydroxide that is used for the purpose of increasing the pH of the alkali metal silicate aqueous solution include sodium hydroxide, potassium hydroxide, and lithium hydroxide. Incidentally, an alkaline earth metal salt or a salt of a metal belonging to the Group 4 may be compounded in the above-mentioned treatment liquid.

Examples of the alkaline earth metal salt include water-soluble salts such as nitrates (for example, calcium nitrate, strontium nitrate, magnesium nitrate, and barium nitrate), sulfates, hydrochlorides, phosphates, acetates, oxalates, and borates.

Examples of the salt of a metal belonging to the Group 4 include titanium tetra-chloride, titanium trichloride, potassium titanium fluoride, potassium titanium oxalate, titanium sulfate, titanium tetraiodide, zirconium oxide chloride, zirconium dioxide, zirconium oxychloride, and zirconium tetrachloride.

The alkaline earth metal salt or salt of a metal belonging to the Group 4 may be used singly or in combination of two or more thereof.

Such a metal salt is preferably used in an amount in the range of from 0.01 to 10 wt %, and more preferably in the range of from 0.05 to 5.0 wt %. Also, silicate electrodeposition described in U.S. Pat. No. 3,658,662 is effective.

Furthermore, a surface treatment by combining an electrolytically grained support disclosed in JP-B-46-27481, JP-A-52-58602, and JP-A-52-30503 with the for the above-mentioned anodic oxidation treatment and hydrophilization treatment is useful.

Back-Coat Layer

The back surface of the support in the lithographic printing plate precursor used in the present invention may be coated with a back-coat layer as necessary.

For the back-coat layer, coat layers comprising organic polymer compounds such as those described in JP-A-5-45885, and metal oxides formed by hydrolyzing and polycondensing organic or inorganic metal compounds such as those described in JP-A-6-35174 are preferably used.

Of these, especially preferred for the back-coat layer are silicon alkoxides such as $Si(OCH_3)_4$, $Si(OC_2H_5)_4$, $Si(OC_3H_7)_4$, and $Si(OC_4H_9)_4$ since they are inexpensive and easily available and coat layers of such metal oxides are highly resistant to developers.

Protective Layer

In the lithographic printing plate precursor in the present invention, a protective layer (oxygen-blocking layer) may be provided on the photosensitive layer in order to prevent diffusion and penetration of oxygen which inhibits the polymerization reaction at the time of exposure.

The protective layer preferably has oxygen permeability (A) at 25° C. under one atmosphere of $1.0 \leq (A) \leq 20$ (ml/m²·day). When the oxygen permeability (A) is 1.0 (ml/m²·day) or more, an unwanted polymerization reaction can be suppressed during production and storage and also fogging and increase in line width can be suppressed. Furthermore, when the oxygen permeability (A) is 20 (ml/m²·day) or less, an excellent sensitivity can be obtained. The oxygen permeability (A) is more preferably $1.5 \leq (A) \leq 12$ (ml/m²·day), yet more preferably $2.0 \leq (A) \leq 10$ (ml/m²·day)

Besides the above-mentioned oxygen permeability, as for the characteristics required of the protective layer, it is desired that the protective layer does not substantially hinder the transmission of light for the exposure, is excellent in the adhesion property to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, for example a water-soluble polymer compound relatively excellent in crystallizability is preferably used. Specifically, a water-soluble polymer such as polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is cited. The water-soluble polymer compounds may be used singly or in combination thereof.

The components of the protective layer (selection of water-soluble polymer and use of additives) and the coating amount are determined considering fogging property, adhesion property and scratch resistance besides the oxygen-blocking property and removability by development.

The molecular weight of the water-soluble polymer is preferably from 2,000 to 10,000,000, more preferably from 20,000 to 3,000,000.

As other additive of the protective layer, glycerin, dipropylene glycol or the like can be added in an amount corresponding to several wt % of the (co)polymer to provide flexibility. Furthermore, an anionic surfactant such as sodium alkylsulfate or sodium alkylsulfonate; an amphoteric surfactant such as alkylaminocarboxylate and alkylaminodicarboxylate; or a nonionic surfactant such as polyoxyethylene alkyl ether and polyoxyethylene alkyl phenyl ether can be added in an amount corresponding to several wt % of the (co)polymer.

Furthermore, the adhesion property of the protective layer to the photosensitive layer and scratch resistance are also extremely important in view of handling of the printing plate precursor. Specifically, when a hydrophilic layer comprising a water-soluble polymer is layered on the oleophilic photosensitive layer, layer peeling due to an insufficient adhesion property is liable to occur, and the peeled portion causes such a defect as failure in curing of the photosensitive layer due to polymerization inhibition by oxygen. Various proposals have been made for improving the adhesion property between two layers. For example, it is described in U.S. patent application Ser. Nos. 292,501 and 44,563 that a sufficient adhesion property can be obtained by mixing from 20 to 60 wt % of an acryl-based emulsion or a water-insoluble vinyl pyrrolidone/vinyl acetate copolymer with a hydrophilic polymer mainly comprising polyvinyl alcohol and layering the resulting mixture on the photosensitive layer. Any of these known techniques can be applied to the protective layer according to the present invention. Coating methods of the protective layer are described in detail, for example, in U.S. Pat. No. 3,458,311 and JP-B-55-49729.

Furthermore, it is also preferred to incorporate an inorganic stratiform compound into the protective layer of the lithographic printing plate precursor for the purpose of improving the oxygen-blocking property and property for protecting the surface of photosensitive layer.

The inorganic stratiform compound used here is a particle having a thin tabular shape and includes, for example, mica, for example, natural mica or synthetic mica; talc represented by the following formula: $3MgO \cdot 4SiO \cdot H_2O$; taeniolite; montmorillonite; saponite; hectorite; and zirconium phosphate.

An aspect ratio of the inorganic stratiform compound is preferably 20 or more, more preferably 100 or more, yet more preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound, an average major axis is preferably from 0.3 to 20 μm, more preferably from 0.5 to 10 μm, yet preferably from 1 to 5 μm. An average thickness of the particle is preferably 0.1 μm or less, more preferably 0.05 μm or less, yet more preferably 0.01 μm or less.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under high humidity conditions, it is prevented from decrease in the image-forming property thereof due to the change of humidity and exhibits excellent preservation stability.

The content of the inorganic stratiform compound in the protective layer is preferably from 5/1 to 1/100 in terms of weight ratio to the amount of binder used in the protective layer. When a plurality of inorganic stratiform compounds are used in combination, it is also preferred that the total amount of the inorganic stratiform compounds fulfills the above-mentioned weight ratio.

Examples of dispersing methods for the inorganic stratiform compound used in the protective layer are described in JP-A-2007-171406, JP-A-2007-206216, JP-A-2007-206217, JP-A-2007-225701, JP-A-2007-225702, JP-A-2007-316582, and JP-A-2007-328243.

The coating weight after drying of the photosensitive layer is preferably in the range of from 0.05 to 10 $g/m^2$. It is more preferably in the range of from 0.1 to 1.0 $g/m^2$ when the inorganic stratiform is contained therein, and is also more preferably in the range of from 0.5 to 5 $g/m^2$ when the inorganic stratiform is not contained therein.

Exposure Step

The process for making a lithographic printing plate according to the present invention comprises an exposure step of imagewise exposing a lithographic printing plate precursor that comprises, above a hydrophilic support, a photosensitive layer comprising (A) a compound that generates a radical upon the application of light or heat, (B) a polymer having an aromatic carboxy group in a side chain, (C) a polymerizable compound and (D) an infrared absorber.

An infrared laser is an example of the light source suitable for exposing the lithographic printing plate precursor usable in the present invention, and thermal recording by a UV lamp or a thermal head is also possible.

Among them, in the present invention, the image exposure is preferably performed using a solid laser or semiconductor laser capable of radiating an infrared light at the wavelength of 750 to 1,400 nm.

The laser output is preferably 100 mW or more and in order to shorten the exposure time, a multi-beam laser device is preferably used. The exposure time is preferably 20μ seconds or less per pixel.

The energy irradiated on the lithographic printing plate is preferably from 10 to 300 $mJ/cm^2$. When the energy is in the above-mentioned range, curing proceeds sufficiently and also laser ablation is suppressed to prevent the damage of the image.

The light exposure in the present invention may be carried out by overlapping beams from a light source.

The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping may be quantitatively expressed in FWHM/sub-scanning pitch (overlapping coefficient). In the present invention, the overlapping coefficient is preferably 0.1 or more.

The scanning system for a light source in the light exposure device used in the present invention is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

Development Processing Step

Development processing step is described in detail.

The process for making a lithographic printing plate of the present invention comprises a development processing step using one type of processing liquid, wherein the processing liquid has a pH of 8.5 to 10.8. It is preferable that the development processing step is a step of carrying out in one bath at least two from removal of a protective layer, removal of unexposed photosensitive layer, and a gumming treatment.

While, in the ordinary development processing step, the protective layer is removed by the pre-development water washing step as necessary, then alkaline development is conducted, alkali is removed from the plate in the post-development water washing step, and the printing plate is coated with gum in the gumming treatment step to be dried in the drying step, the development processing step of the present invention can be carried out using one type of processing liquid.

An aqueous solution containing a buffering agent, and a surfactant and/or a water-soluble polymeric compound is preferably used, which enables development and gumming treatment to be conducted using one type of processing liquid. Therefore, post-development water washing step is not necessary. It is preferable that remaining processing liquid is removed after development using squeezing roller before the drying step. The "gumming treatment" in the present invention means a surface treatment using surfactants or water-soluble polymer compounds.

Development processing step in the present invention is suitably carried out by an automatic processor equipped with supply means of the processing liquid and a rubbing member.

Examples of the automatic processor used in the present invention include an automatic processor described in JP-A-2-220061 and JP-A-60-59351 in which a lithographic printing plate precursor after imagewise recording is subjected to a rubbing treatment while being transported, and an automatic processor described in U.S. Pat. Nos. 5,148,746 and 5,568,768 and GB Patent No. 2,297,719 in which a lithographic printing plate precursor after imagewise recording is placed on a cylinder and subjected to a rubbing treatment while the cylinder being rotating. Among them, an automatic processor using a rotating brush roller as the rubbing member is particularly preferable.

The rotating brush roller may be appropriately selected by taking account, for example, of the scratch resistance of the image area and the robustness of the support of the lithographic printing plate precursor. As the rotating brush roller, a known rotating brush roller produced by implanting a brush material in a plastic or metal roller may be used. For example, a rotating brush roller described in JP-A-58-159533 and JP-A-3-100554, or a brush roller described in JU-B-62-167253 (JU-B denotes a Japanese examined utility model application publication), in which a metal or plastic groove-shaped member having a brush material implanted in rows therein is closely radially wrapped around a plastic or metal roller acting as a core, may be used.

As the brush material, a plastic fiber (for example, a polyester-based synthetic fiber such as polyethylene terephthalate or polybutylene terephthalate; a polyamide-based synthetic fiber such as nylon 6.6 or nylon 6.10; a polyacrylic synthetic fiber such as polyacrylonitrile or a polyalkyl(meth)acrylate; or a polyolefin-based synthetic fiber such as polypropylene or polystyrene) may be used.

A brush material having a fiber bristle diameter of 20 to 400 μm and a bristle length of 5 to 30 mm may suitably be used.

Furthermore, the outer diameter of the rotating brush roller is preferably 30 to 200 mm, and the peripheral speed at the tip of the brush rubbing the plate surface is preferably 0.1 to 5 m/sec.

Furthermore, it is preferable to use a plurality, that is, two or more, rotating brush rollers.

The direction of rotation of the rotating brush roller may be the same direction or the opposite direction with respect to the transport direction of the lithographic printing plate precursor, but when two or more rotating brush rollers are used in an automatic processor, it is preferable that at least one rotating brush roller rotates in the same direction and at least one rotating brush roller rotates in the opposite direction. By such an arrangement, the photosensitive layer in the non-image area can be more reliably removed. Furthermore, rocking the rotating brush roller in the rotational axis direction of the brush roller is also effective.

After the development processing step, the drying step is preferably provided consecutively or non-consecutively. Drying is conducted by hot air, infrared ray, far-infrared ray or the like.

One of the structural examples of an automatic processor suitably used in the process for making lithographic printing plate of the present invention is diagrammatically shown in FIG. 1. The automatic processor shown in FIG. 1 is basically composed of a development zone 6 and a drying zone 10, and a lithographic printing plate precursor 4 is subjected to development processing step in a development tank 20 and drying in a drying zone 10.

In the present invention, the lithographic printing plate precursor after the rubbing treatment may be subsequently subjected to water washing, a drying treatment and an oil-desensitization treatment, if desired.

In the oil-desensitization treatment, a known oil-desensitizing solution can be used. Furthermore, it is possible if appropriate that prior to the development processing, the lithographic printing plate precursor is preliminarily subjected to the water washing treatment to remove the protective layer, however, it is preferable that removal of the protective layer and a non-exposed area of photosensitive layer is conducted in a one-bath process.

Processing Liquid

The processing liquid (hereinafter also called 'developer') used in the development processing step is preferably an aqueous solution comprising a buffering agent, and a surfactant and/or a water-soluble polymeric compound.

The developer used in the present invention preferably comprises a surfactant.

The surfactant may comprise any of anionic, nonionic, cationic, and amphoteric surfactants.

Examples of the anionic surfactant include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, sulfated castor oil, sulfated tallow oil, a sulfate ester of a fatty acid alkyl ester, an alkylsulfate ester, a polyoxyethylene alkyl ether sulfate ester, a fatty acid monoglyceride sulfate ester, a polyoxyethylene alkyl phenyl ether sulfate ester, a polyoxyethylene styrylphenyl ether sulfate ester, an alkyl phosphate ester, a polyoxyethylene alkyl ether phosphate ester, a polyoxyethylene alkyl phenyl ether phosphate ester, a partially saponified styrene-maleic anhydride copolymer, a partially saponified olefin-maleic anhydride copolymer, a naphthalenesulfonic acid salt formalin condensate, an aromatic sulfonic acid salt, and an aromatic substituted polyoxyethylenesulfonic acid salt.

Among them, a dialkylsulfosuccinic acid salt, an alkylsulfate ester, and an alkylnaphthalenesulfonic acid salt are particularly preferably used.

The cationic surfactant is not particularly limited, and a conventionally known cationic surfactant may be used. Examples thereof include an alkylamine salt, a quaternary ammonium salt, a polyoxyethylene alkylamine salt, and a polyethylene polyamine derivative.

Examples of the nonionic surfactant include a polyethylene glycol type higher alcohol ethylene oxide adduct, an alkylphenol ethylene oxide adduct, an aromatic compound polyethylene glycol adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide.

In the present invention, a polyethylene glycol type higher alcohol ethylene oxide adduct, an aromatic compound polyethylene glycol adduct, a sorbitol and/or sorbitan fatty acid ester ethylene oxide adduct, a polypropylene glycol ethylene oxide adduct, a dimethylsiloxane-ethylene oxide block copolymer, a dimethylsiloxane-(propylene oxide-ethylene oxide) block copolymer, and a polyhydric alcohol fatty acid ester are preferable.

Furthermore, from the viewpoint of stable solubility in water and turbidity, for the nonionic surfactant the HLB (Hydrophile-Lipophile Balance) value is preferably at least 6, and more preferably at least 8.

It is also possible to similarly use acetylene glycol type and acetylene alcohol type oxyethylene adducts, fluorine type, silicone type etc. surfactants.

The surfactant may be used singly or in combination of two or more types.

The content of the surfactant in the developer is preferably 0.01 to 10 wt %, and more preferably 0.01 to 5 wt %.

As is well known in the surfactant field, an amphoteric surfactant is a compound having an anionic portion and a cationic portion in a single molecule, and includes amphoteric surfactants of the amino acid type, betaine type, amine oxide type, etc.

As the amphoteric surfactant that can be used in the developer, a compound represented by Formula [1] below and a compound represented by Formula [2] below are preferable.

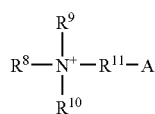 [1]

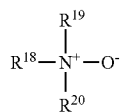 [2]

In Formula [1], $R^8$ denotes an alkyl group, $R^9$ and $R^{10}$ independently denote a hydrogen atom or an alkyl group, $R^{11}$ denotes an alkylene group, and A denotes a carboxylic acid ion or a sulfonic acid ion.

In Formula [2], $R^{18}$, $R^{19}$, and $R^{20}$ independently denote a hydrogen atom or an alkyl group, but not all of $R^{18}$, $R^{19}$, and $R^{20}$ are hydrogen atoms.

In Formula [1] above, the alkyl group denoted by $R^8$, $R^9$, or $R^{10}$ and the alkylene group denoted by $R^{11}$ may be a straight chain or a branched chain, may have a linking group in the chain, and may further have a substituent. As the linking group, one containing a hetero atom, such as an ester bond, an amide bond, or an ether bond is preferable. Furthermore, as the substituent a hydroxy group, an ethylene oxide group, a phenyl group, an amide group, a halogen atom, etc. are preferable.

In the compound represented by Formula [1], the sum total of the carbons of $R^8$ to $R^{11}$ is preferably 8 to 25, and more preferably 11 to 21. In this range, a hydrophobic portion is appropriate enough to give the excellent solubility in an aqueous developer.

Furthermore, by adding an organic solvent such as an alcohol as a dissolution auxiliary, the solubility of a surfactant in an aqueous developer can be improved.

In Formula [2] above, the alkyl group denoted by $R^{18}$, $R^{19}$, or $R^{20}$ may be a straight chain or a branched chain, may have a linking group in the chain, and may further have a substituent. As the linking group, one containing a hetero atom, such as an ester bond, an amide bond, or an ether bond is preferable. Furthermore, as the substituent a hydroxy group, an ethylene oxide group, a phenyl group, an amide group, a halogen atom, etc. are preferable.

In the compound represented by Formula [2], the sum total of the carbons of $R^{18}$ to $R^{20}$ is preferably 8 to 22, and more preferably 10 to 20. In this range, a hydrophobic portion is appropriate, and the solubility in an aqueous developer is excellent.

The total number of carbons of the amphoteric surfactant might depend on the properties of a material used in the photosensitive layer, in particular a binder. In the case of a highly hydrophilic binder, one in which the total number of carbons is relatively small is preferable, and when the binder used has a low degree of hydrophilicity one in which the total number of carbons is large tends to be preferable.

Preferred specific examples of the amphoteric surfactant used in the developer are listed below, but the present invention is not limited thereto.

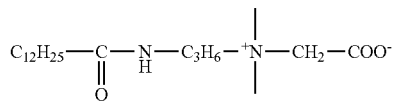 W-1

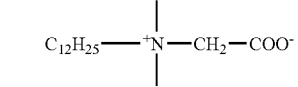 W-2

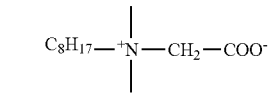 W-3

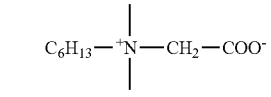 W-4

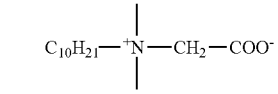 W-5

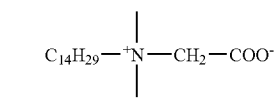 W-6

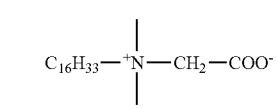 W-7

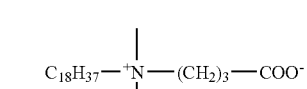 W-8

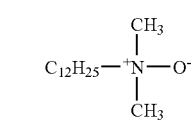 W-9

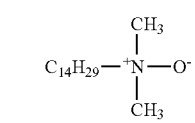 W-10

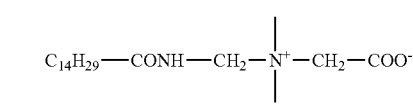 W-11

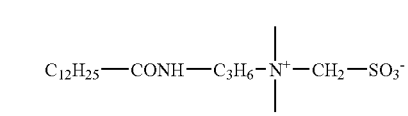 W-12

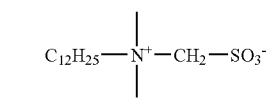 W-13

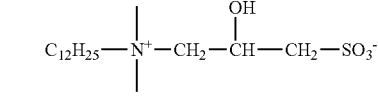 W-14

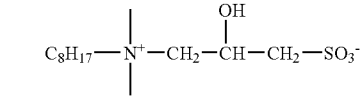 W-15

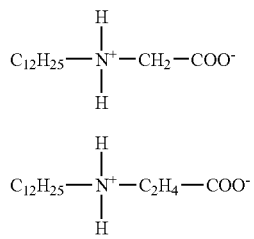

W-16

W-17

The developer used in the present invention preferably contains a pH buffer agent (hereinafter also called simply 'buffer agent')

The pH buffer agent is not particularly limited as long as it is a buffer agent exhibiting a buffering action and the pH buffer agent exhibiting a buffering action in the range of pH 8.5 to pH 10.8 is preferably used.

In the present invention, an alkaline buffer agent is preferably used, and examples thereof include (a) carbonate ion and hydrogen carbonate ion, (b) borate ion, (c) a water-soluble amine compound and an ion of the amine compound, and the combined use thereof. That is, for example, (a) a combination of carbonate ion-hydrogen carbonate ion, (b) borate ion, or (c) a combination of water-soluble amine compound-ion of the amine compound can exhibit a pH buffering action in the developer, can suppress change in pH when the developer is used for a long period of time, and can suppress degradation of developability, the occurrence of development residue, etc. due to change in pH. A combination of carbonate ion and hydrogen carbonate ion is particularly preferable.

In order to make (a) carbonate ion and hydrogen carbonate ion present in the developer, a carbonate salt and a hydrogen carbonate salt may be added to the developer, or carbonate ion and hydrogen carbonate ion may be formed by adjusting the pH after a carbonate salt or a hydrogen carbonate salt is added.

The carbonate salt and the hydrogen carbonate salt are not particularly limited, but an alkali metal salt is preferable. As the alkali metal, lithium, sodium, and potassium can be cited, and sodium is particularly preferable. They may be used singly or in combination of two or more types.

In order to make (b) borate ion present in the developer, after boric acid and/or a boric acid salt is added to the developer, the pH is adjusted using an alkali or an alkali and an acid, thus forming an appropriate amount of borate ion.

The boric acid or the boric acid salt used here is not particularly limited, and known boric acid and boric acid salt may be used.

Examples of the boric acid include orthoboric acid, metaboric acid, and tetraboric acid, and among them orthoboric acid and tetraboric acid are preferable. The boric acid may be used singly or in combination of two or more types.

Furthermore, examples of the boric acid salt include an alkali metal salt and an alkaline earth metal salt; an orthoboric acid salt, a diboric acid salt, a metaboric acid salt, a tetraboric acid salt, a pentaboric acid salt, and an octaboric acid salt can be cited, and among them an orthoboric acid salt and a tetraboric acid salt, in particular an alkali metal tetraboric acid salt, are preferable. Preferred examples of the tetraboric acid salt include sodium tetraborate, potassium tetraborate, and lithium tetraborate, and among them sodium tetraborate is preferable. The boric acid salt may be used singly or in combination of two or more types.

As the boric acid and/or boric acid salt that can be used in the present invention, orthoboric acid, tetraboric acid, and/or sodium tetraborate are particularly preferable. The developer may use boric acid and a boric acid salt in combination.

The ion of the water-soluble amine compound (c) can be generated in an aqueous solution of the water-soluble amine compound, an alkali or an acid may further be added to the aqueous solution of the water-soluble amine compound, or it can be made present in an aqueous solution by adding a compound that is a salt of the amine compound itself.

The water-soluble amine compound is not particularly limited, but is preferably a water-soluble amine compound having a group that promotes water-solubility. Examples of the group that promotes water-solubility include a carboxylic acid group, a sulfonic acid group, a sulfinic acid group, a phosphonic acid group, and a hydroxy group. The water-soluble amine compound may contain a plurality of these groups in combination.

When the water-solubility of an amine compound is promoted by a carboxylic acid group, a sulfonic acid group, a sulfinic acid group, or a phosphonic acid group, the amine compound corresponds to an amino acid. An amino acid is in equilibrium in an aqueous solution, and when the acid group is for example a carboxylic acid group, the equilibrium can be expressed as shown below. The amino acid referred to in the present invention means state B below, and the ion of an amino acid referred to means state C below. As a counterion in state C, sodium ion or potassium ion is preferable.

(Equilibrium of Amino Acid (when Acid Group is Carboxylic Acid))

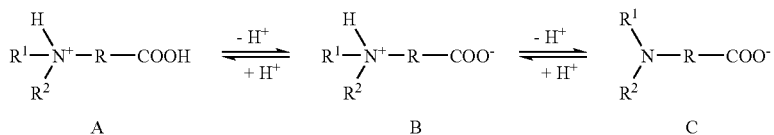

A        B        C (For example, $R^1$ and $R^2$ independently denote a hydrogen atom, an alkyl group, an aryl group, etc., and R denotes a linking group.)

Specific examples of the water-soluble amine compound having a carboxylic acid group, a sulfonic acid group, or a sulfinic acid group include amino acids such as glycine, iminodiacetic acid, lysine, threonine, serine, aspartic acid, parahydroxyphenylglycine, dihydroxyethylglycine, alanine, anthranilic acid, and tryptophan; sulfamic acid, fatty acid aminesulfonic acids such as cyclohexylsulfamic acid and taurine; and fatty acid aminesulfinic acids such as aminoethanesulfinic acid. Among them, glycine and iminodiacetic acid are preferable.

Specific examples of the water-soluble amine compound having a phosphonic acid group (including a phosphinic acid group) include 2-aminoethylphosphonic acid, 1-aminoethane-1,1-diphosphonic acid, 1-amino-1-phenylmethane-1,1-diphosphonic acid, 1-dimethylaminoethane-1,1-diphosphonic acid, and ethylenediaminopentamethylenephosphonic acid. 2-aminoethylphosphonic acid is particularly preferable.

The water-soluble amine compound having a hydroxy group as the group promoting water-solubility means an alkylamine having a hydroxy group on the alkyl group (state B' below), and an ion thereof means an ammonium ion of the amino group (state A' below).

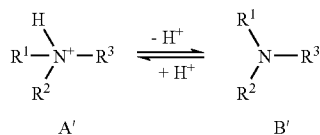

(For example, $R^1$, $R^2$, and $R^3$ independently denote a hydrogen atom, an alkyl group, an aryl group, etc. At least one of $R^1$, $R^2$, and $R^3$ is an alkyl group having a hydroxy group.)

Specific examples of the water-soluble amine compound having a hydroxy group include monoethanolamine, diethanolamine, trimethanolamine, triethanolamine, tripropanolamine, and triisopropanolamine. Among them, triethanolamine and diethanolamine are preferable. As the ammonium ion counterion, chloride ion is preferable.

Examples of an alkali that can be used for adjustment of pH include sodium hydroxide, potassium hydroxide, lithium hydroxide, sodium carbonate, potassium carbonate, ammonium carbonate, sodium hydrogen carbonate, potassium hydrogen carbonate, ammonium hydrogen carbonate, an organic alkali agent, and a combination thereof. Furthermore, as an acid an inorganic acid such as, for example, hydrochloric acid, sulfuric acid, or nitric acid may be used. Adding such an alkali or acid enables the pH to be finely adjusted.

The pH of the developer containing (a) carbonate ion and hydrogen carbonate ion used in the present invention is preferably in the range of 8.5 to 10.8. When the pH is at least 8.5 the developability of a non-image area can be improved, whereas when it is 10.8 or lower the influence of carbon dioxide in the air can be reduced and degradation of processing capacity due to the influence of carbon dioxide can be suppressed. The pH is more preferably in the range of 8.5 to 10.2, and particularly preferably in the range from 8.5 to less than 10.0.

When as the pH buffer agent the combination (a) carbonate ion and hydrogen carbonate ion is used, the total amount of carbonate ion and hydrogen carbonate ion is preferably 0.05 to 5 mol/L relative to the total amount of developer, more preferably 0.1 to 2 mol/L, and particularly preferably 0.2 to 1 mol/L. When the total amount is at least 0.05 mol/L the developability and processing capacity do not deteriorate, and when it is 5 mol/L or less there is hardly any formation of a precipitate or crystals, there is hardly any gelling when carrying out neutralization during waste solution treatment for the developer, and waste solution treatment can be carried out without problems.

Furthermore, for the purpose of finely adjusting the alkali concentration or assisting dissolution of a non-image area of the photosensitive layer, an alkali agent, for example, an organic alkali agent may be added supplementarily.

Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These alkali agents may be used singly or in combination of two or more types.

When as the pH buffer agent (b) borate ion is used as the pH buffer agent, the total amount of borate ion is preferably 0.05 to 5 mol/L relative to the total weight of the processing liquid, more preferably 0.1 to 2 mol/L, and particularly preferably 0.2 to 1 mol/L. When the total amount of boric acid salt is at least 0.05 mol/L, the developability and processing capacity do not deteriorate, and when it is 5 mol/L or less there is hardly any formation of a precipitate or crystals, there is hardly any gelling when carrying out neutralization during waste solution processing for the developer, and waste solution processing can be carried out without problems.

When a water-soluble amine compound and an ion of the amine compound are used as a pH buffer agent (c), the total amount of water-soluble amine compound and ion of the amine compound is preferably 0.01 to 1 mol/L relative to the total weight of the developer, more preferably 0.03 to 0.7 mol/L, and particularly preferably 0.05 to 0.5 mol/L. When the total amount of water-soluble amine compound and ion of the amine compound is in the above-mentioned range, the developability and processing capacity do not degrade, and waste solution processing is easy.

The processing liquid used in the present invention preferably contains a water-soluble polymer (hereinafter also called a 'water-soluble resin').

Examples of the water-soluble resin that can be contained in the developer in the present invention includes soybean polysaccharide, modified starch, gum Arabic, dextrin, a cellulose derivative (for example, carboxymethylcellulose, carboxyethylcellulose or methylcellulose) or a modified product thereof, pullulan, polyvinyl alcohol or a derivative thereof, polyvinylpyrrolidone, polyacrylamide, an acrylamide copolymer, a vinyl methyl ether/maleic anhydride copolymer, a vinyl acetate/maleic anhydride copolymer, and a styrene/maleic anhydride copolymer.

Furthermore, the acid value of the water-soluble resin is preferably 0 to 3.0 meq/g.

As for the soybean polysaccharide, those conventionally known may be used. For example, as a commercial product, Soyafibe (Fuji Oil Co., Ltd.) is available, and various product grades can be used. The soybean polysaccharide preferably used has a viscosity in the range of 10 to 100 mPa/sec in a 10 wt % aqueous solution thereof.

As the modified starch, there is, for example, one represented by Formula (III) below. As the starch represented by Formula (III), any starch from corn, potato, tapioca, rice, wheat, etc. may be used. Modification of these starches may be carried out by, for example, a method in which they are decomposed with, for example, an acid or an enzyme to the extent that the number of glucose residues per molecule is from 5 to 30 and then oxypropylene is added thereto in an alkali.

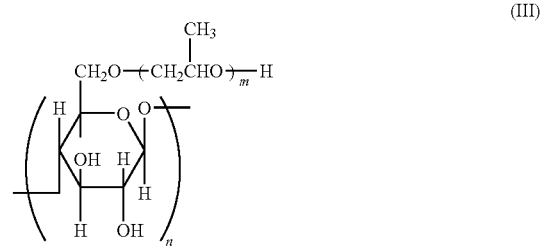

In Formula (III), the degree of etherification (degree of substitution) is in the range of 0.05 to 1.2 per glucose unit, n denotes an integer of 3 to 30, and m denotes an integer of 1 to 3.

Examples of modified starch and derivatives thereof include roasted starch such as British gum, enzymatically-modified dextrin such as enzyme dextrin and Shardinger dextrin, oxidized starch such as solubilized starch, pregelatinized starch such as modified pregelatinized starch and unmodified pregelatinized starch, esterified starch such as starch phosphate, fatty starch, starch sulfate, starch nitrate, starch xanthate and starch carbamate, etherified starch such as carboxyalkyl starch, hydroxyalkyl starch, sulfoalkyl starch, cyanoethyl starch, allyl starch, benzyl starch, carbamylethyl starch and dialkylamino starch, crosslinked starch such as methylol-crosslinked starch, hydroxyalkyl-crosslinked starch, phosphoric acid-crosslinked starch and dicarboxylic acid-crosslinked starch, and starch graft polymers such as starch polyacrylamide copolymer, starch polyacrylic acid copolymer, starch polyvinyl acetate copolymer, starch polyacrylonitrile copolymer, cationic starch polyacrylic acid ester copolymer, cationic starch vinyl polymer copolymer, starch polystyrene maleic acid copolymer, starch polyethylene oxide copolymer and starch polypropylene copolymer.

Among the water-soluble resins, soybean polysaccharide, modified starch, gum Arabic, dextrin, carboxymethylcellulose, polyvinyl alcohol, etc. are preferable. The water-soluble resin may be used in combination of two or more types.

The content of the water-soluble resin in the processing liquid is preferably 0.1 to 20 wt %, and more preferably 0.5 to 10 wt %.

The processing liquid used in the present invention preferably contains an organic acid, more preferably a hydroxy carboxy acid and/or a salt thereof (hereinafter simply called 'hydroxy carboxy acid'), and yet more preferably a hydroxy carboxy acid having two or more carboxy groups.

The above-mentioned organic acid can also be used as a salt such an alkali metal salt and an ammonium salt.

Furthermore, the processing liquid used in the present invention yet more preferably contains an ion species of a hydroxy carboxy acid (a hydroxy carboxylate anion) and particularly preferably an ion species of a hydroxy carboxy acid (hydroxy carboxylate anion) having two or more carboxy groups. Fingerprint marking is effectively prevented thereby.

Ionization of the hydroxy carboxy acid in the processing liquid can be achieved by using a salt of hydroxy carboxy acid or setting pH of the processing liquid at not less than pKa value of hydroxyl carboxy acid. Furthermore, as for a hydroxy carbon acid having two or more carboxy groups, the number of ionized carboxy groups ($—COO^-$) may be either one or more.

Examples of the organic acid include a citric acid, an acetic acid, an oxalic acid, a malonic acid, a salicylic acid, a caprylic acid, a tartaric acid, a malic acid, a lactic acid, a levulinic acid, p-toluenesulfonic acid, a xylenesulfonic acid, a phytic acid, and an organic phosphonic acid.

Among them, the preferred examples are the hydroxy carboxy acids such as a citric acid, salicylic, a tartaric acid, a malic acid, a gluconic acid, a lactic acid, and the more preferred examples are the hydroxy carboxy acid having two or more carboxy groups such as a citric acid, a tartaric acid, and a malic acid.

In addition to those described above, the processing liquid in the present invention may contain a wetting agent, a preservative, a chelating compound, a defoaming agent, an organic solvent, an inorganic acid, an inorganic salt, etc.

Examples of the wetting agent which can be suitably used include ethylene glycol, propylene glycol, triethylene glycol, butylene glycol, hexylene glycol, diethylene glycol, dipropylene glycol, glycerin, trimethylolpropane and diglycerin.

The wetting agent may be used singly or in combination of two or more thereof.

The content of the wetting agent is preferably 0.1 to 5 wt % relative to the total weight of the processing liquid.

As the preservative, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. It is preferable to use in combination at least two types of preservatives so as to exhibit efficacy toward various types of molds and bacteria.

The amount of preservative added is an amount that exhibits stable efficacy toward bacteria, molds, yeasts, etc., and preferably in the range of 0.01 to 4 wt % relative to the processing liquid, depending on the type of bacterium, molds, or yeast.

As the chelating compound, for example, ethylenediaminetetraacetic acid, the potassium salt thereof, or the sodium salt thereof; diethylenetriaminepentaacetic acid, the potassium salt thereof, or the sodium salt thereof; triethylenetetraminehexaacetic acid, the potassium salt thereof, or the sodium salt thereof; hydroxyethylethylenediaminetriacetic acid, the potassium salt thereof, or the sodium salt thereof; nitrilotriacetic acid or the sodium salt thereof; an organic phosphonic acid, for example, 1-hydroxyethane-1,1-diphosphonic acid, the potassium salt thereof, or the sodium salt thereof; or aminotri(methylenephosphonic acid), the potassium salt thereof, or the sodium salt thereof; or a phosphonoalkanetricarboxylic acid can be cited. An organic amine salt is also effective instead of the sodium salt or potassium salt of the chelating compounds.

As the chelating agent, one that is present stably in the processing liquid composition and does not inhibit printing properties is selected.

The amount of chelating agent added is suitably 0.001 to 1.0 wt % relative to the processing liquid.

As the antifoaming agent, a normal silicone-based self emulsifying type, emulsifying type, nonionic type compound having an HLB of not more than 5, and the like may be used. Among them, a silicone antifoaming agent is preferable.

Furthermore, any of an emulsifying dispersion type and a solubilizing type antifoaming agent may be used.

The content of the antifoaming agent is suitably in the range of 0.001 to 1.0 wt % relative to the processing liquid.

Examples of the organic solvent include an aliphatic hydrocarbon (e.g. hexane, heptanes, Isopar E, H, G (Esso Chemical Co., Ltd.), gasoline, or kerosene), an aromatic hydrocarbon (e.g. toluene or xylene), a halogenated hydrocarbon (e.g. methylene dichloride, ethylene dichloride, triclene, or monochlorobenzene), and a polar solvent.

Examples of the polar solvent include an alcohol (e.g. methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, or methylamyl alcohol), a ketone (e.g. acetone, methyl ethyl ketone, ethyl butyl ketone, methyl isobutyl ketone, or cyclohexanone), an ester (e.g. ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, or butyl levulinate), and others (e.g. triethyl phosphate, tricresyl phosphate, N-phenylethanolamine, or N-phenyldiethanolamine).

Furthermore, when the organic solvent is insoluble in water, it may be employed by being solubilized in water using a surfactant, etc. In the case where the processing liquid contains an organic solvent, the concentration of the organic solvent is preferably less than 40 wt % from the viewpoint of safety and inflammability.

As the inorganic acid and an inorganic salt, for example, phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate can be cited.

The content of the inorganic salt is preferably 0.01 to 0.5 wt % relative to the total weight of the developer.

The development temperature is preferably not more than 60° C., and more preferably on the order of 15° C. to 40° C. In development processing using an automatic processor, since processing liquid might be exhausted depending on the amount processed, the processing performance may be recovered by use of a replenisher or fresh processing liquid.

After the development processing step, the developer attached to the lithographic printing plate may be dried by natural drying, but it is preferable to provide a drying step employing hot air, etc.

In the present invention, although the development processing can be carried out just after the exposure step as described above, the heat treatment step may intervene between the exposure step and the development processing step. The heat treatment is effective for increasing the plate life and improving uniformity of the image hardness degree in the surface of printing plate. The conditions of the heat treatment may be appropriately set within a range for providing such effects.

Examples of the heating means include a conventional convection oven, an IR irradiation apparatus, an IR laser, a microwave apparatus or a Wisconsin oven. For instance, the heat treatment can be conducted by maintaining the plate preferably at a plate surface temperature ranging from 70 to 150° C. for a period of one second to 5 minutes, more preferably at 80 to 140° C. for 5 seconds to one minute, yet more preferably at 90 to 130° C. for 10 to 30 seconds. In the above-mentioned range, the effects described above are efficiently achieved and adverse effects such as deformation of the printing plate due to the heat can be prevented.

Furthermore in the present invention, the development processing step is conducted after the exposure step, or, as necessary, after the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to an automatically continuous processing. Specifically, a plate-making line wherein the plate setter and the development apparatus are connected with each other by transport means such as a conveyer is illustrated. Also, the heat treatment means may be placed between the plate setter and the development apparatus, or the heat treatment means and the development apparatus may constitute a unit apparatus.

When a lithographic printing plate precursor used is susceptible to ambient light in the operating environment, the above-mentioned plate making line is preferably shielded from light by a filter or a cover.

The printing plate after an image-formation by development may be subjected to overall exposure using actinic radiation such as UV rays so as to promote curing of an image area.

Examples of a light source used for overall exposure include a carbon arc lamp, a mercury lamp, a gallium lamp, a metal halide lamp, a xenon lamp, a tungsten lamp, and various types of laser light.

Furthermore, in order to obtain sufficient plate life, the overall exposure is preferably at least 10 $mJ/cm^2$, and more preferably at least 100 $mJ/cm^2$.

Heating may be carried out at the same time as above-mentioned overall exposure, and it is observed that plate life is further improved by heating.

As a heating device, a commonly used convection oven, IR irradiator, IR laser, microwave device, Wisconsin oven, etc. can be cited.

In this process, the plate surface temperature is preferably 30° C. to 150° C., more preferably 35° C. to 130° C., and yet more preferably 40° C. to 120° C. Specifically, a method described in JP-A-2000-89478 may be utilized.

The lithographic printing plate thus obtained is set in an offset printer, and used for printing of a large number of sheets.

In the process for making a lithographic printing plate of the present invention, the lithographic printing plate may be post-heated or post-exposed on the entire area of the image, after development, in order to improve the image strength and plate life. In the heating after the development, very severe conditions may be used. However, the heating is usually performed in the temperature range of 200 to 500° C. in order to give a sufficient image-strengthening effect and suppress the damage of the support and the image area caused by the heat.

The lithographic printing plate obtained by the above-mentioned treatments is fitted into an offset printer, thereby giving a great number of printed sheets.

Stains on the lithographic printing plate having been used for printing may be cleaned with a plate cleaner. The plate cleaner used for removing stains on the plate during printing may be a known plate cleaner for PS plates, and specific examples thereof include CL-1, CL-2, CP, CN-4, CN, CG-1, PC-1, SR and IC (each of which is manufactured by FUJIFILM Co., Ltd.)

In accordance with the present invention, there can be provided a process for making lithographic printing plate that has excellent plate life and development processability and suppresses fingerprint marking.

EXAMPLES

The present invention is explained below by way of Examples, but the present invention should not be construed as being limited thereto.

Preparation of Support

Using an aluminum sheet of JIS A1050 having a thickness of 0.30 mm and a width of 1,030 mm, the following surface treatment was carried out.

Surface Treatment

In the surface treatment, the following treatments (a) to (f) were successively conducted. After each treatment and water washing, a remaining liquid was removed with nip rollers.

(a) The aluminum sheet was subjected to etching treatment with an aqueous solution containing sodium hydroxide at a concentration of 26 wt % and aluminum ion at a concentration of 6.5 wt % at a temperature of 70° C. so as to dissolve 5 g/m$^2$ of the aluminum sheet. Thereafter, the aluminum plate was washed with water.

(b) The aluminum sheet was subjected to desmutting treatment with a spray of an aqueous solution of 1 wt % nitric acid (also containing 0.5 wt % of an aluminum ion) at a temperature of 30° C., and then was washed with water.

(c) The sheet was subjected to continuous electrochemical surface roughening treatment with an alternating voltage of 60 Hz. An electrolytic solution used was 1 wt % aqueous nitric acid solution (containing 0.5 wt % of aluminum ion and 0.007 wt % of ammonium ion) at a temperature of 30° C. The electrochemical surface roughening treatment was carried out with a carbon electrode as a counter electrode, using a trapezoid rectangular wave alternating current wherein the time TP required for the electric current to change from 0 to the peak value was 2 msec and the duty ratio was 1:1. Ferrite was used as an auxiliary anode. The current density was 25 A/dm$^2$ in terms of the electric current peak value, and the quantity of electricity was 250 C/dm$^2$ in terms of total quantity of electricity at the time the aluminum sheet works as the anode. 5% of the electric current from the power source was distributed to the auxiliary anode. Thereafter, the sheet was washed with water.

(d) The aluminum sheet was subjected to etching treatment by spraying with an aqueous solution containing sodium hydroxide at a concentration of 26 wt % and aluminum ion at a concentration of 6.5 wt % at a temperature of 35° C., whereby the aluminum sheet was dissolved in an amount of 0.2 g/m$^2$ to remove smut components mainly composed of aluminum hydroxide generated during the electrochemical surface roughening treatment using the alternating current in the previous stage, and smoothen the edge portion of the generated pit through dissolution of the edge portion. Thereafter, the aluminum sheet was washed with water.

(e) The aluminum sheet was subjected to desmutting treatment with a spray of an aqueous solution of 25 wt % sulfuric acid (also containing 0.5 wt % aluminum ion) at a temperature of 60° C. and then was washed with sprayed water.

(f) The aluminum sheet was subjected to anodizing treatment for 50 seconds in an aqueous solution of sulfuric acid at a concentration of 170 g/L (containing 0.5 wt % aluminum ion) at a temperature of 33° C. and a current density of 5 (A/dm$^2$). Thereafter, washing by spraying with water was carried out. The amount of the anodized coating was 2.7 g/m$^2$.

The surface roughness (Ra) of the aluminum support obtained in this manner was 0.27 (measured with SURFCOM (manufactured by Tokyo Seimitsu Co., Ltd.) provided with a probe tip diameter of 2 micrometer), the surface area ratio (ΔS) thereof was 75%, and the steepness (a45) thereof was 44% (measured with SPA300 or SPI3800N: manufactured by Seiko Instruments Inc.)

Formation of Undercoat Layer

Then, on a surface of the aluminum support, an undercoating solution below was coated by use of a wire bar and dried at 100° C. for 10 sec. A coated amount was 5 mg/m$^2$.

Composition of the Undercoating Solution

| Poly(vinyl phosphorous acid) | 0.024 parts by weight |
| Methanol | 27 parts by weight |
| Ion-exchanged water | 3 parts by weight |

Formation of Photosensitive Layer

Then, the photosensitive coating liquid below was prepared and coated on the aluminum support which had been subjected to the surface treatment above to give a thickness after drying of 1.4 μm and the resultant was dried in a dryer of 70° C. for 5 minutes, so as to provide a lithographic printing plate precursor.

Photosensitive Layer Coating Liquid

| (A) radical generator (A-1) | 0.6 parts by weight |
| (A) radical generator (A-2) | 0.9 parts by weight |
| (B) Specific polymer (B-1) | 4.7 parts by weight |
| (weight average molecular weight: 80,000) | |
| (C) di-pentaerythritol hexaacrylate | 3.0 parts by weight |
| (D) infrared absorber (D-1) | 0.3 parts by weight |
| Chloride salt of Victoria Pure Blue | 0.3 parts by weight |
| Ethylene glycol monomethyl ether | 70.0 parts by weight |
| Methyl ethyl ketone | 20.0 parts by weight |

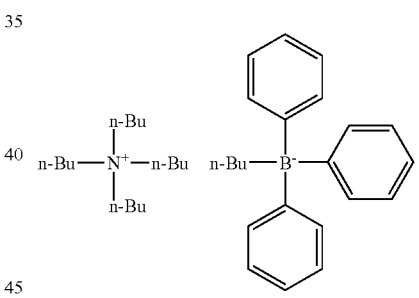

(A-1)

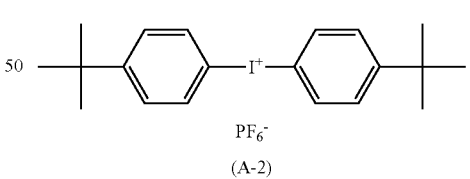

(A-2)

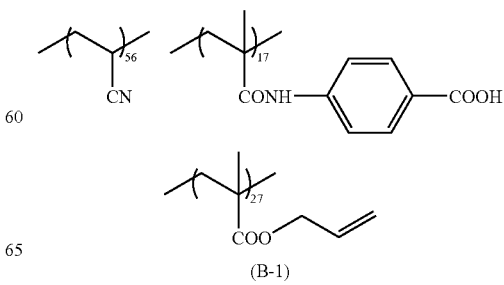

(B-1)

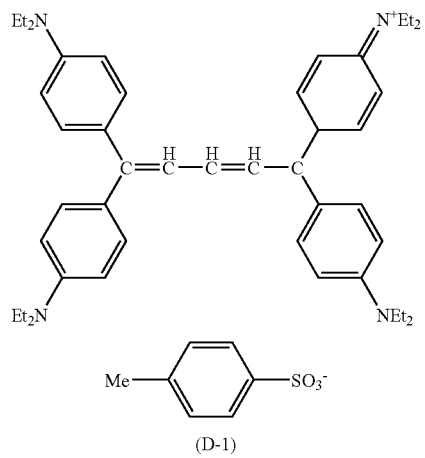

(D-1)

Examples 1 to 22, and Comparative Examples 1 to 3

Exposure Step, Development Processing Step and Printing

Each of the lithographic printing plate precursors was subjected to image exposure by Trendsetter 3244VX, produced by Creo Co., equipped with a water-cooled 40 W infrared semiconductor laser (wavelength: 830 nm) under the conditions of a resolution of 175 lpi, a half tone dot area rate of 50%, an output of 8 W, an exterior drum rotational speed of 206 rpm, a plate surface energy of 100 mJ/cm².

Then, development processing step was performed in an automatic development processor having a structure shown in FIG. 1 using each of processing liquids having the composition shown in the table 1 to 4 below. The automatic development processor was an automatic processor having a 25 L development tank and a brush roller having an outer diameter of 50 mm and being implanted with fiber of polybutylene terephthalate (bristle diameter: 200 μm, bristle length: 17 mm), and the brush roller was rotated at 200 rpm in the same direction as the transporting direction (peripheral velocity at the tip of brush: 0.52 m/sec). The temperature of each processing liquid was 28° C. The transportation of the lithographic printing plate precursor was performed at transporting speed of 100 cm/min. After the development processing, drying was conducted in the drying zone. The temperature of drying was 80° C.

Evaluation

Plate Life

The resulting lithographic printing plate was used in printing with a printing machine Lithron (manufactured by Komori Corporation), while the ink was wiped using Multicleaner (manufactured by FUJIFILM Co., Ltd.) from the surface of the printing plate after printing of every 10,000 prints. The number of complete prints was regarded as an indicator of plate life. When the number of printed papers increases by further continuing printing, an abrasion of the photosensitive layer gradually proceeds, and an ink receptivity lowers, so that the density of ink on the printing paper decreases. Plate life was evaluated by the number of the printed matters at the time when the ink density (reflection density) reduced by 0.1 from the starting time of printing.

The lithographic printing plates were left under the condition of 25° C. and 60% RH for 1 week after being prepared. Then the plate life (after 1 week) was evaluated in the same manner described above.

The evaluation results are given in Table 5.

Processability

After development-processing 500 m² for each lithographic printing plate precursor in an automatic development processor under above-mentioned conditions for a week, generation of scum adhering to the tank wall of the automatic development processor was evaluated with an eye. During the processing, replenishment of processing liquid was not conducted, and only lost water by evaporation was replenished. The rating was "excellent" for no scum generation, "fair" for scum generation in the allowable level, and "poor" for serious scum generation.

Fingerprint Marking

The non-image area of each printing plate thus developed with the above method is pressed for 10 sec with the thumb, and then these developed plates were left without the protection such as a slip sheet under the condition of a room temperature (25° C.) and 70% RH for a week. Printing using each plate was conducted to evaluate the degree of printing stain where the thumb was pressed. A criterion of evaluation is described below.

Excellent: no printing stain was observed

Fair: minimal dotted stain was observed as an acceptable level

Poor: fingerprint marking was observed

Each composition of processing liquids used in Examples 1 to 22 and Comparative Examples 1 to 3 is shown in Tables 1 to 4. The evaluation results of Examples 1 to 22 and Comparative Examples 1 to 3 is shown in Tables 5.

TABLE 1

| | processing liquid (weight ratio) | | | | | | |
|---|---|---|---|---|---|---|---|
| | No. 1 | No. 2 | No. 3 | No. 4 | No. 5 | No. 6 | No. 7 |
| pH | 9.7 | 9.7 | 9.7 | 9.5 | 9.8 | 9.5 | 9.4 |
| water | 9129.8 | 8813.8 | 8515 | 8859.8 | 8000.8 | 8100 | 6949.8 |
| sodium carbonate | 130 | 200 | 150 | 200 | 200 | 160 | 130 |
| sodium hydrogen carbonate | 70 | 100 | 80 | 140 | 80 | 160 | 70 |
| Newcol B13 | 500 | — | — | — | — | — | — |
| Newcol B4SN (61% aqueous solution) | — | 656 | — | — | — | — | — |
| Eleminol MON (47% aqueous solution) | — | — | 745 | — | — | — | — |
| Pionin D3110 | — | — | — | 450 | — | — | — |
| PELEX NBL (35% aqueous solution) | — | — | — | — | 1429 | — | — |
| Pionin C157K | — | — | — | — | — | 1250 | — |
| Takesurf C-157-L | — | — | — | — | — | — | 2500 |
| ammonium dihydrogen phosphate | 20 | — | 180 | 20 | 20 | — | — |
| sodium hexametaphosphate | — | — | 180 | — | — | 180 | — |
| propylene glycol | — | — | — | 80 | 80 | — | — |
| EDTA 4Na | — | 80 | — | — | — | — | 50 |
| 2-bromo-2-nitropropane-1,3-diol | 0.1 | 0.1 | — | 0.1 | 0.1 | — | 0.1 |

TABLE 1-continued

|  | processing liquid (weight ratio) | | | | | | |
| --- | --- | --- | --- | --- | --- | --- | --- |
|  | No. 1 | No. 2 | No. 3 | No. 4 | No. 5 | No. 6 | No. 7 |
| 2-methyl-4-isothiazoline-3-one | 0.1 | 0.1 | — | 0.1 | 0.1 | — | 0.1 |
| trisodium citrate | 150 | 150 | 150 | 150 | 150 | 150 | 150 |
| sodium citrate | — | — | — | 100 | — | — | 150 |
| citric acid | — | — | — | — | 40 | — | — |

TABLE 2

|  | processing liquid (weight ratio) | | | | | | |
| --- | --- | --- | --- | --- | --- | --- | --- |
|  | No. 8 | No. 9 | No. 10 | No. 11 | No. 12 | No. 13 | No. 14 |
| pH | 8.5 | 9.0 | 9.4 | 10.0 | 10.5 | 9.7 | 9.7 |
| water | 9129.8 | 9129.8 | 9129.8 | 9129.8 | 9129.8 | 9129.8 | 9129.8 |
| sodium carbonate | 10 | 20 | 80 | 150 | 180 | 130 | 130 |
| sodium hydrogen carbonate | 190 | 180 | 120 | 50 | 20 | 70 | 70 |
| Newcol B13 | 500 | 500 | 500 | 500 | 500 | 500 | 500 |
| ammonium dihydrogen phosphate | 20 | 20 | 20 | 20 | 20 | 20 | 20 |
| 2-bromo-2-nitropropane-1,3-diol | 0.1 | 0.1 | 0.1 | 0.1 | 0.1 | 0.1 | 0.1 |
| 2-methyl-4-isothiazolin-3-one | 0.1 | 0.1 | 0.1 | 0.1 | 0.1 | 0.1 | 0.1 |
| trisodium citrate | 150 | 150 | 150 | 150 | 150 | — | — |
| tripotassium citrate | — | — | — | — | — | 150 | — |
| citric acid | — | — | — | — | — | — | 150 |

TABLE 3

|  | processing liquid (weight ratio) | | | | | |
| --- | --- | --- | --- | --- | --- | --- |
|  | No. 15 | No. 16 | No. 17 | No. 18 | No. 19 | No. 20 |
| pH | 9.7 | 9.7 | 9.7 | 9.7 | 9.7 | 9.7 |
| water | 9129.8 | 9129.8 | 9129.8 | 9155.8 | 9232.4 | 8579.8 |
| sodium carbonate | 130 | 130 | 130 | — | — | 130 |
| sodium hydrogen carbonate | 70 | 70 | 70 | — | — | 70 |
| boric acid | — | — | — | 115 | — | — |
| glycine | — | — | — | — | 75 | — |
| sodium hydroxide | — | — | — | 59 | 22.4 | — |
| Newcol B13 | 500 | 500 | 500 | 500 | 500 | 500 |
| ammonium dihydrogen phosphate | 20 | 20 | 20 | 20 | 20 | 20 |
| 2-bromo-2-nitropropane-1,3-diol | 0.1 | 0.1 | 0.1 | 0.1 | 0.1 | 0.1 |
| 2-methyl-4-isothiazoline-3-one | 0.1 | 0.1 | 0.1 | 0.1 | 0.1 | 0.1 |
| trisodium citrate | — | — | — | 150 | 150 | 150 |
| disodium tartrate | 150 | — | — | — | — | — |
| disodium malate | — | 150 | — | — | — | — |
| sodium gluconate | — | — | 150 | — | — | — |
| hydroxyalkylated starch | — | — | — | — | — | 550 |

TABLE 4

|  | processing liquid (weight ratio) | | | | |
| --- | --- | --- | --- | --- | --- |
|  | No. 21 | No. 22 | Comp. No. 1 | Comp. No. 2 | Comp. No. 3 |
| pH | 9.7 | 9.7 | 8.0 | 11.0 | 11.9 |
| water | 9279.8 | 9279.8 | 9129.8 | 9129.8 | 9305.8 |
| sodium carbonate | 130 | 130 | — | 200 | — |
| sodium hydrogen carbonate | 70 | 70 | 200 | — | — |
| Newcol B13 | 500 | 500 | 500 | 500 | 500 |
| ammonium dihydrogen phosphate | 20 | 20 | 20 | 20 | 20 |
| 2-bromo-2-nitropropane-1,3-diol | 0.1 | 0.1 | 0.1 | 0.1 | 0.1 |
| 2-methyl-4-isothiazolin-3-one | 0.1 | 0.1 | 0.1 | 0.1 | 0.1 |
| sodium acetate | — | 150 | — | — | — |
| trisodium citrate | — | — | 150 | 150 | 150 |
| potassium carbonate | — | — | — | — | 17 |
| potassium hydroxide | — | — | — | — | 7 |

TABLE 5

| | processing liquid No. | plate life (×1,000 sheets) printing just after prepared | plate life (×1,000 sheets) printing after 1 week | development processability | fingerprint marking |
|---|---|---|---|---|---|
| Ex. 1 | 1 | 50 | 45 | Excellent | Excellent |
| Ex. 2 | 2 | 55 | 50 | Excellent | Excellent |
| Ex. 3 | 3 | 50 | 50 | Excellent | Excellent |
| Ex. 4 | 4 | 55 | 50 | Excellent | Excellent |
| Ex. 5 | 5 | 50 | 45 | Excellent | Excellent |
| Ex. 6 | 6 | 55 | 50 | Excellent | Excellent |
| Ex. 7 | 7 | 50 | 50 | Excellent | Excellent |
| Ex. 8 | 8 | 60 | 55 | Fair | Excellent |
| Ex. 9 | 9 | 55 | 50 | Excellent | Excellent |
| Ex. 10 | 10 | 55 | 50 | Excellent | Excellent |
| Ex. 11 | 11 | 55 | 50 | Excellent | Excellent |
| Ex. 12 | 12 | 50 | 45 | Excellent | Excellent |
| Ex. 13 | 13 | 55 | 50 | Excellent | Excellent |
| Ex. 14 | 14 | 55 | 50 | Excellent | Excellent |
| Ex. 15 | 15 | 55 | 50 | Excellent | Fair |
| Ex. 16 | 16 | 55 | 50 | Excellent | Fair |
| Ex. 17 | 17 | 55 | 50 | Excellent | Fair |
| Ex. 18 | 18 | 55 | 50 | Excellent | Excellent |
| Ex. 19 | 19 | 55 | 50 | Excellent | Excellent |
| Ex. 20 | 20 | 55 | 50 | Fair | Very Excellent |
| Ex. 21 | 21 | 55 | 50 | Fair | Fair |
| Ex. 22 | 22 | 55 | 50 | Fair | Fair |
| Comp. Ex. 1 | Comp. 1 | 60 | 55 | Poor | Excellent |
| Comp. Ex. 2 | Comp. 2 | 45 | 20 | Excellent | Excellent |
| Comp. Ex. 3 | Comp. 3 | 40 | 15 | Poor | Excellent |

Marketed products in the Tables are as follows.

Newcol B13: polyoxyethylene β-naphthyl ether (average number of oxyethylene: n=13, manufactured by Nippon Nyukazai Co., Ltd.)

Newcol B4SN (61% aqueous solution): polyoxyethylene aryl ether sulfuric acid ester salts (manufactured by Nippon Nyukazai Co., Ltd.)

Eleminol MON (47% aqueous solution): sodium dodecyl diphenyl ether disulfonate (manufactured by Sanyo Chemical Industries, Ltd.)

Pionin D3110: higher alkyl amine-ethylene oxide adducts (manufactured by Takemoto Oil & Fat Co., Ltd.)

PELEX NBL (35% aqueous solution): alkyl naphthalene sulphonic acid salt (manufactured by Kao Corp.)

Pionin C157K: alkyl dimethyl aminoacetic acid betaine (manufactured by Takemoto Oil & Fat Co., Ltd.)

TAKESURF C-157-L: alkyl dimethyl aminoacetic acid betaine (manufactured by Takemoto Oil & Fat Co., Ltd.)

EDTA 4Na is an abbreviation of tetrasodium ethylenediaminetetraacetate.

Furthermore, as for hydroxyalkylated starch, PENON JE66 (manufactured by Nippon Starch Chemical Co.) is used.

From the result in Table 5, one can see that there is little decrease in plate life even after being left over a period of time and no generation of scum in the development tank. Furthermore, fingerprint marking was not generated even by being handled by bare hands.

The invention claimed is:

1. A process for making a lithographic printing plate, comprising:
an exposure step of imagewise exposing a lithographic printing plate precursor that comprises, above a hydrophilic support, a photosensitive layer comprising (A) a compound that generates a radical upon the application of light or heat, (B) a polymer having a monomer unit containing an aromatic carboxy group represented by the following formula (B-1), a monomer unit derived from acrylonitrile, and a monomer unit containing an ethylenically unsaturated group, (C) a polymerizable compound, and (D) an infrared absorber,

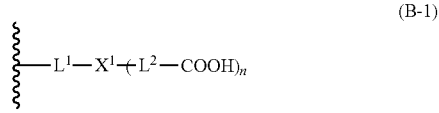

(B-1)

wherein $L^1$ is —CONH—, $X^1$ is a phenyl group, $L^2$ is a monovalent bond and n is 1,
wherein the content of the monomer unit containing the aromatic carboxy group is from 10 to 30 units, the content of the monomer unit containing the ethylenically unsaturated group is from 10 to 40 units, and the content of the monomer unit derived from acrylonitrile is from 30 to 70 units, taking the number of the total monomer units as 100 units;
wherein a water-washing step is not carried out either prior to or subsequent to the development processing step, and
a development processing step using one type of processing liquid, wherein the processing liquid has a pH of 8.5 to 10.8.

2. The process for making a lithographic printing plate according to claim 1, wherein the processing liquid is an aqueous solution comprising a buffering agent, and a surfactant and/or a water-soluble polymeric compound.

3. The process for making a lithographic printing plate according to claim 2, wherein the buffering agent comprises a carbonate salt.

4. The process for making a lithographic printing plate according to claim 1, wherein the processing liquid comprises a low-molecular weight hydroxycarboxylic acid and/or a salt thereof.

5. The process for making a lithographic printing plate according to claim 4, wherein the low-molecular weight hydroxycarboxylic acid has two or more carboxy groups.

6. The process for making a lithographic printing plate according to claim 4, wherein the low-molecular weight hydroxycarboxylic acid is at least one type selected from the group consisting of citric acid, tartaric acid, and malic acid.

7. The process for making a lithographic printing plate according to claim 1, wherein the processing liquid comprises a chelating compound.

8. The process for making a lithographic printing plate according to claim 1, wherein the development processing step is a step of carrying out in one bath at least two from removal of a protective layer, removal of unexposed photosensitive layer, and a gumming treatment.

9. The process for making a lithographic printing plate according to claim 1, wherein the compound (A) that generates a radical upon the application of light or heat is an organic boron salt and/or an onium salt compound.

10. The process for making a lithographic printing plate according to claim 1, wherein the processing liquid has a pH of at least 8.5 but less than 10.

11. The process for making a lithographic printing plate according to claim 1, wherein the content of the monomer unit containing the aromatic carboxy group is from 10 to 25 units, the content of the monomer unit containing the ethylenically unsaturated group is from 15 to 35 units, and the content of the monomer unit derived from acrylonitrile is from 30 to 70 units, taking the number of the total monomer units as 100 units.

* * * * *